US012777690B2

(12) United States Patent
Ju et al.

(10) Patent No.: US 12,777,690 B2
(45) Date of Patent: Oct. 27, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Shi Ning Ju, Hsinchu (TW); Kuo-Cheng Chiang, Hsinchu (TW); Guan-Lin Chen, Hsinchu (TW); Jung-Chien Cheng, Hsinchu (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 601 days.

(21) Appl. No.: 18/099,783

(22) Filed: Jan. 20, 2023

(65) Prior Publication Data

US 2024/0145540 A1 May 2, 2024

Related U.S. Application Data

(60) Provisional application No. 63/421,675, filed on Nov. 2, 2022.

(51) Int. Cl.

*H10D 62/10* (2025.01)
*H10D 30/67* (2025.01)
*H10D 62/13* (2025.01)
*H10D 84/01* (2025.01)
*H10D 84/03* (2025.01)

(52) U.S. Cl.

CPC ....... *H10D 62/121* (2025.01); *H10D 30/6757* (2025.01); *H10D 62/151* (2025.01); *H10D 84/013* (2025.01); *H10D 84/0158* (2025.01); *H10D 84/038* (2025.01)

(58) Field of Classification Search

CPC ............. H10D 62/121; H10D 30/6757; H10D 62/151; H10D 84/013; H10D 84/0158; H10D 84/038; H10D 30/6735; H10D 84/0151; H10D 84/83

See application file for complete search history.

(56) References Cited

U.S. PATENT DOCUMENTS

| | | | | |
|---|---|---|---|---|
| 10,084,041 | B2 * | 9/2018 | Cheng | H10D 30/024 |
| 2013/0069081 | A1 * | 3/2013 | Blatchford | H10D 89/10 257/E21.409 |
| 2015/0214219 | A1 * | 7/2015 | Cai | H10D 84/0135 438/300 |
| 2019/0035929 | A1 * | 1/2019 | Syue | H10D 30/658 |
| 2021/0407999 | A1 * | 12/2021 | Huang | H10D 30/43 |

* cited by examiner

*Primary Examiner* — Marlon T Fletcher
*Assistant Examiner* — Da Wei Lee
(74) *Attorney, Agent, or Firm* — Birch, Stewart, Kolasch & Birch, LLP

(57) ABSTRACT

A semiconductor device includes a first active region, a second active region and a dielectric wall. The second active region disposed adjacent to the first active region, and there is a first space between the first active region and the second active region. The dielectric wall is formed within the first space and has a first sidewall and a second sidewall opposite to the first sidewall. The first sidewall and the second sidewall opposite to the first sidewall continuously extend along a plane.

20 Claims, 21 Drawing Sheets

SEMICONDUCTOR DEVICE AND MANUFACTURING METHOD THEREOF

PRIORITY CLAIM AND CROSS-REFERENCE

This application claims the benefit of U.S. provisional application Ser. No. 63/421,675, filed Nov. 2, 2022, the subject matter of which is incorporated herein by reference.

BACKGROUND

One of the goals of the semiconductor industry is to continue shrinking the size and increasing the speed of individual field-effect transistors (FETs), which include, for example, metal oxide semiconductor (MOS) transistors. To achieve these goals, nanosheet structure is developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
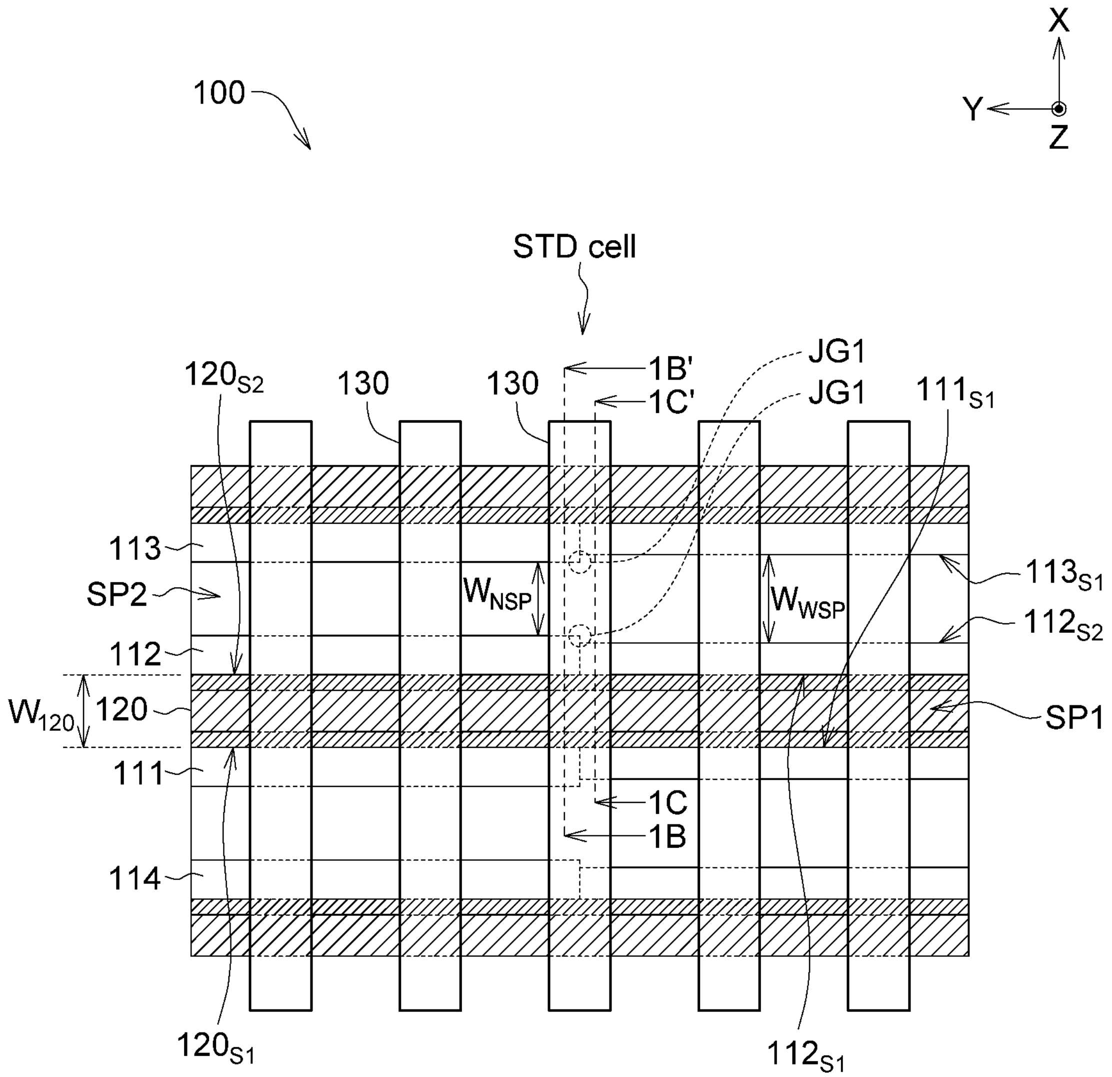
FIG. 1A illustrates a schematic diagram of a semiconductor device according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
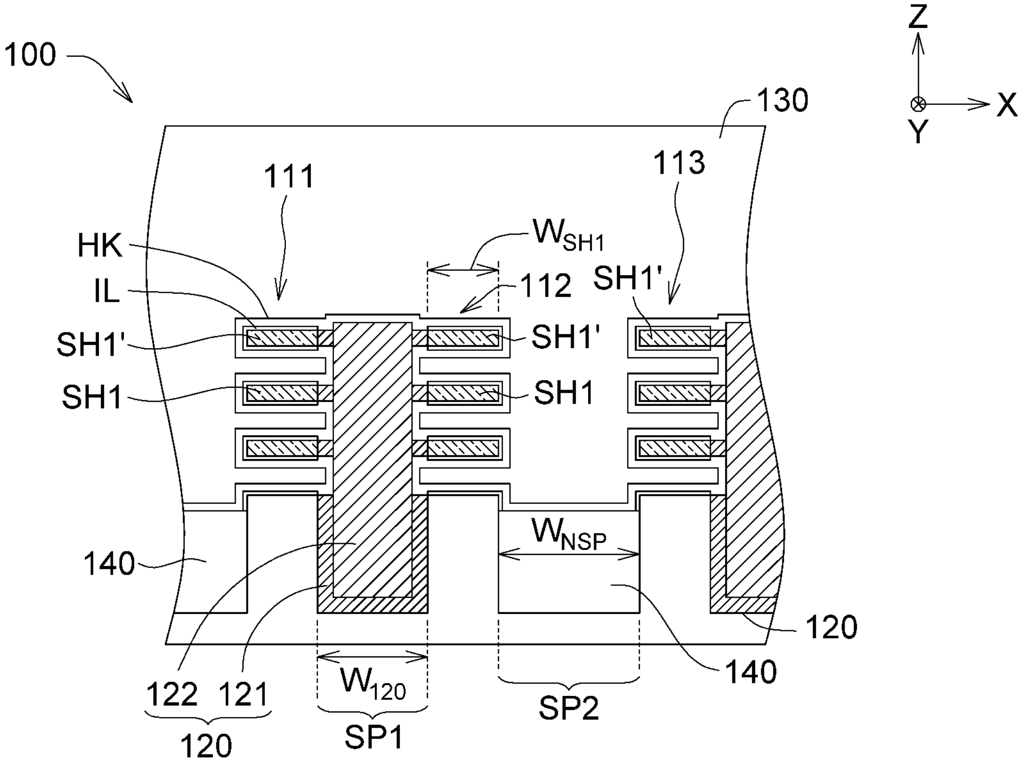
FIG. 1B illustrates cross-sectional view of the semiconductor device of FIG. 1A along a direction 1B-1B'.
Figure 1C:
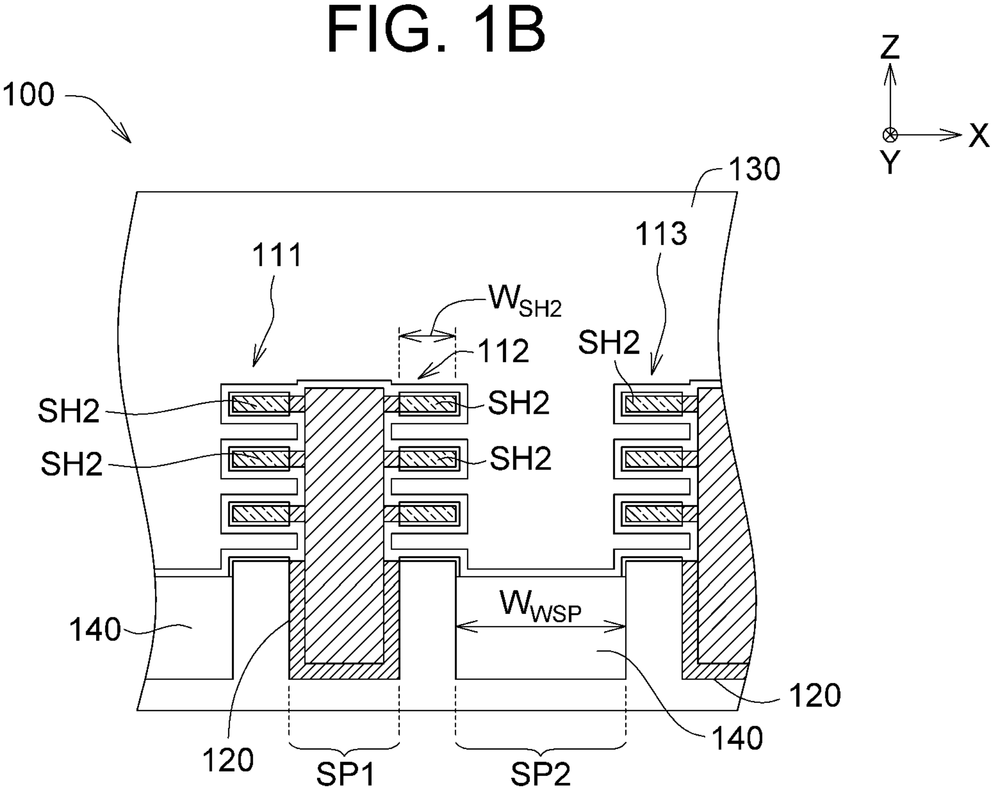
FIG. 1C illustrates cross-sectional view of the semiconductor device of FIG. 1A along a direction 1C-1C'.

Referring to FIGS. 1A to 1C, FIG. 1A illustrates a schematic diagram of a semiconductor device 100 according to an embodiment of the present disclosure, FIG. 1B illustrates cross-sectional view of the semiconductor device 100 of FIG. 1A along a direction 1B-1B', and FIG. 1C illustrates cross-sectional view of the semiconductor device 100 of FIG. 1A along a direction 1C-1C'.

The semiconductor device 100 is, for example, a forksheet semiconductor device.

As illustrated in FIG. 1A, the semiconductor device 100 includes a plurality of active regions, such as a first active region 111, a second active region 112 and a third active region 113, and at least one dielectric wall 120. The second active region 112 is disposed adjacent to the first active region 111, wherein there is a first space SP1 between the first active region 111 and the second active region 112, and there is no jog within the first space SP1. The dielectric wall 120 is formed within the first space SP1 between the first active region 111 and the second active region 112. Due to there being no jog within the first space SP1, the dielectric wall 120 may fill up the first space SP1.

As illustrated in FIG. 1A, the first active region 111 has a first lateral surface 111*s*1, and the second active region 112 has a second lateral surface 112*s*1 opposite to the first lateral surface 111*s*1. The first lateral surface 111*s*1 and the second lateral surface 112*s*1 continuously extend along a direction or a plane (for example, the first lateral surface 111*s*1 and the second lateral surface 112*s*1 are parallel to each other), for example, plane YZ, such that there is no jog within the first space SP1. Accordingly, the dielectric wall 120 has a first lateral wall surface 120*s*1 and a second lateral wall surface 120*s*2 opposite to the first lateral wall surface 120*s*1, wherein the first lateral wall surface 120*s*1 and the second lateral wall surface 120*s*2 continuously extend along a direction or a plane, for example, plane YZ.

As illustrated in FIG. 1A, there is a second space SP2 between the second active region 112 and the third active region 113, and there is at least one jog JG1 formed within the second space SP2. Furthermore, the second active region 112 further has a third lateral surface 112*s*2 opposite to the second lateral surface 112*s*1, the third active region 113 has a fourth lateral surface 113*s*1 faces the third lateral surface 112*s*2. The third lateral surface 112*s*2 and the fourth lateral surface 113*s*1 non-continuously extend along a plurality of planes, such that there is at least one jog JG1 formed within the first space SP1.

In addition, each active region of the semiconductor device 100 is referred to as an oxide definition (OD) region which defines the source or drain diffusion regions of semiconductor device 100. The jog JG1 is also called "OD jog". A plurality of the OD regions of the semiconductor device 100 extend in Y-axis.

As illustrated in FIG. 1A, the semiconductor device 100 further includes a fourth active region 114. The first active region 111 is, for example, P-type active region (or called "OD-P"), the second active region 112 is, for example, P-type active region, the third active region 113 is, for example, N-type active region (or called "OD-N"), and the fourth active region 120 is, for example, N-type active region. At least one portion of the first active region 111, the second active region 112, the third active region 113 and the fourth active region 114 are defined as at least one standard (STD) cell.

As illustrated in FIG. 1A, the semiconductor device 100 further includes at least one metal gate 130, the metal gate 130 crosses the active regions in X-axis. The metal gate 130 may cover or surround the jog JG1 to avoid failure of the epitaxial growth. As illustrated in FIGS. 1B and 1C, the semiconductor device 100 further includes at least one oxide layer 140 fills up a portion second space SP2, and the metal gate 130 fills up another portion of the second space SP2.

As illustrated in FIGS. 1B and 1C, the first active region 111 and the second active region 112 includes a plurality of first sheets SH1, and the dielectric wall 120 may extend to a position corresponding to the topmost sheet SH1'. Each first sheet SH1 has a first sheet width $W_{SH1}$. The first sheet width $W_{SH1}$ ranges, for example, between 15 nanometers (nm) and 30 nm. Due to the jog JG1, the second space SP2 may have different widths in different positions. For example, second space SP2 has a narrower width $W_{NSP}$ and a wider width $W_{WSP}$ greater than the narrower width $W_{NSP}$. The wider width $W_{WSP}$ may range, for example, between ($W_{NSP}$+2 nm) and ($W_{NSP}$+20 nm). The narrower width $W_{NSP}$ may range, for example, between 40 nm and 60 nm. The dielectric wall 120 has a wall width $W_{120}$ ranging, for example, between ($W_{NSP}$−20 nm) and $W_{NSP}$.

As illustrated in FIG. 1B, the dielectric wall 120 may include a shell layer 121 and a core layer 122, wherein the shell layer 121 is formed on sidewalls of the first space SP1, and the core layer 122 is formed on sidewalls of the shell layer 121 and fills up the remaining first space SP1. The shell layer 121 has a thickness ranging, for example, between 2 nm to 6 nm. The shell layer 121 may be formed of a material including, for example, SiOC and/or SiOCN, while the core layer 122 may be formed of a material including, for example, SiN and/or SiCN. In another embodiment, the shell layer 121 may be formed of a material including, for example, SiN and/or SiCN, while the core layer 122 may be formed of a material including, for example, SiOC and/or SiOCN.

As illustrated in FIG. 1B, the semiconductor device 100 further includes at least one interface layer IL formed on the sheets and at least one High-k gate dielectric layer HK over the active regions.

The High-k gate dielectric layer HK may be formed of a material including: (i) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$), and (ii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), (iii) other suitable high-k dielectric materials, or (iv) a combination thereof. As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As illustrated in FIG. 1C, the first active region 111 and the second active region 112 includes a plurality of second sheets SH2, each second sheet SH2 has a second sheet width $W_{SH2}$. As illustrated in FIGS. 1A and 1C, for better gate control and off-state characteristic, the second sheet width $W_{SH2}$ may be narrowed down at some place in STD cell. The second sheet width $W_{SH2}$ ranges, for example, between ($W_{SH1}$−1 nm) and ($W_{SH1}$−10 nm).

Figure 2A:
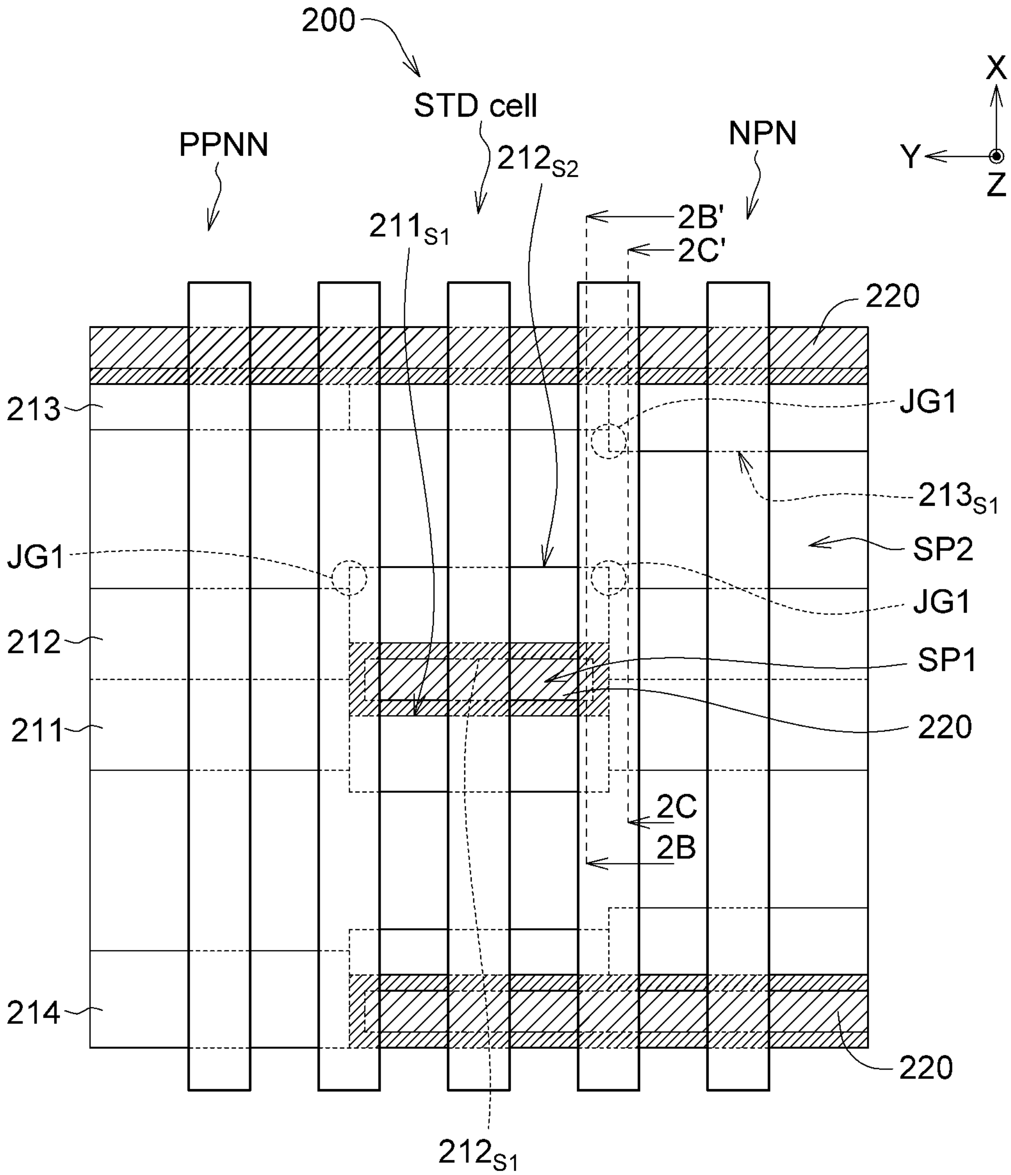
FIG. 2A illustrates a schematic diagram of a semiconductor device according to an embodiment of the present disclosure.
Figure 2B:
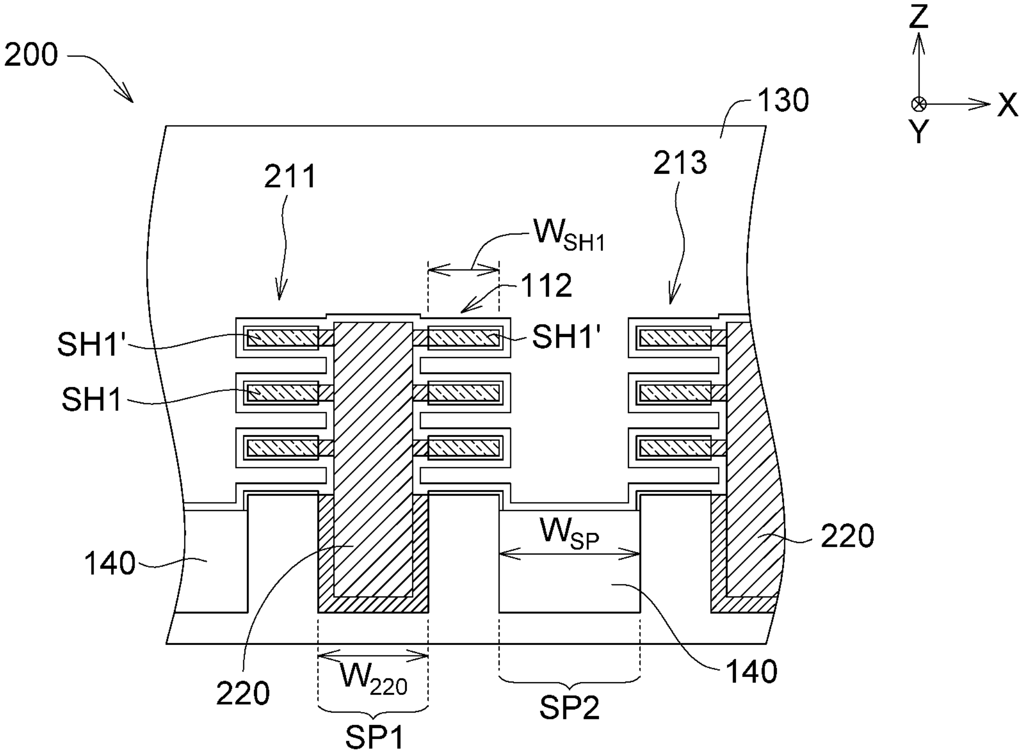
FIG. 2B illustrates cross-sectional view of the semiconductor device of FIG. 2A along a direction 2B-2B.
Figure 2C:
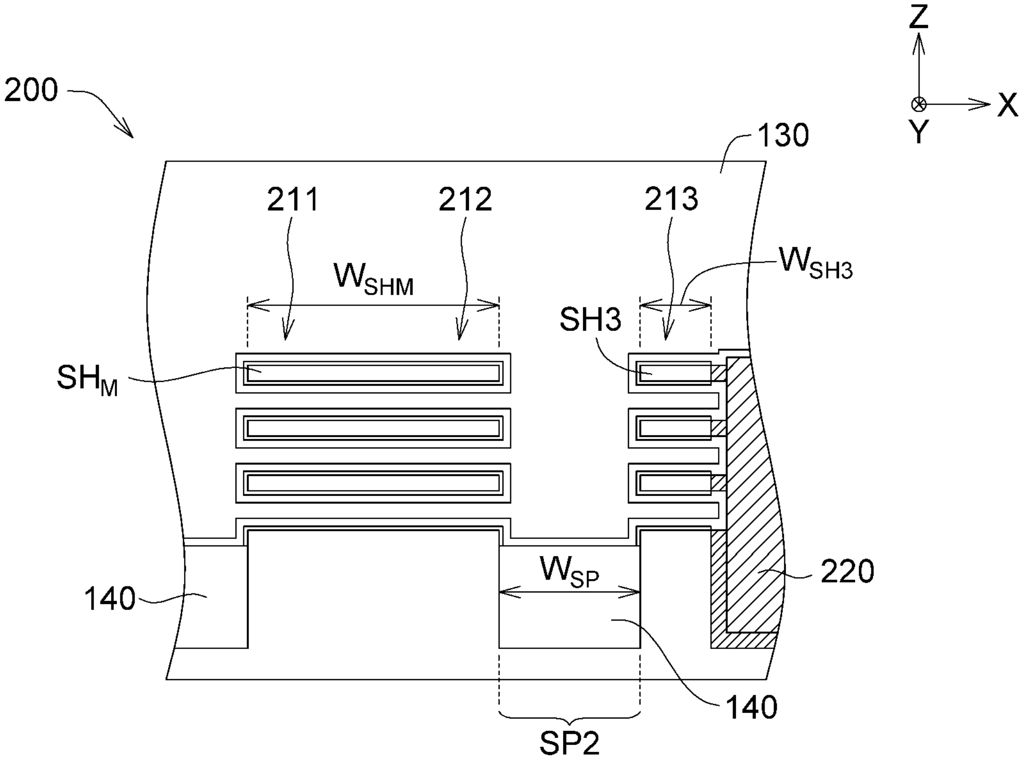
FIG. 2C illustrates cross-sectional view of the semiconductor device of FIG. 2A along a direction 2C-2C'.

Referring to FIGS. 2A to 2C, FIG. 2A illustrates a schematic diagram of a semiconductor device 200 according to an embodiment of the present disclosure, FIG. 2B illustrates cross-sectional view of the semiconductor device 200 of FIG. 2A along a direction 2B-2B', and FIG. 2C illustrates cross-sectional view of the semiconductor device 200 of FIG. 2A along a direction 2C-2C'.

As illustrated in FIG. 2A, the semiconductor device 200 includes a plurality of active regions, such as a first active region 211, a second active region 212 and a third active region 213, and at least one dielectric wall 220. The second active region 212 is disposed adjacent to the first active region 211, wherein there is the first space SP1 between the first active region 211 and the second active region 212, and there is no jog within the first space SP1. The dielectric wall 220 is formed within the first space SP1 between the first active region 211 and the second active region 212. Due to there being no jog within the first space SP1, the dielectric wall 220 may fill up the first space SP1. The dielectric wall 220 includes the structure and/or material the same as or similar to that of the dielectric wall 220, and the similarities will not be repeated here.

As illustrated in FIG. 2A, at least one the dielectric wall 220 may be uniformly formed in the space between OD-N to OD-N or OD-P to OD-P, for example, at cell boundary site. In addition, the first active region 211 and the second active region 212 surround the dielectric wall 220. Furthermore, for the STD cell between NPN/PPNN, the dielectric wall 220 formed between OD-P to OD-P will be self-contained in a square and closed area.

As illustrated in FIG. 2A, the first active region 211 has a first lateral surface 211*s*1, and the second active region 212 has a second lateral surface 212*s*1 opposite to the first lateral surface 211*s*1. The first lateral surface 2110*s*1 and the second lateral surface 212*s*1 continuously extend along a plane, for example, plane YZ, such that there is no jog within the first space SP1.

As illustrated in FIG. 2A, there is the second space SP2 between the second active region 212 and the third active region 213, and there is at least one jog JG1 formed within the second space SP2. Furthermore, the second active region 212 further has a third lateral surface 212*s*2 opposite to the second lateral surface 212*s*1, the third active region 213 has a fourth lateral surface 213*s*1 faces the third lateral surface 212*s*2. The third lateral surface 212*s*2 and the fourth lateral surface 213*s*1 non-continuously extend along different planes, such that there is at least one jog JG1 formed within the second space SP2.

In addition, each active region of the semiconductor device 200 is referred to as an OD region which defines the source or drain diffusion regions of semiconductor device 200. A plurality of the OD regions of the semiconductor device 200 extends in Y-axis.

As illustrated in FIG. 2A, the semiconductor device 200 further includes a fourth active region 220A. The first active region 211 is, for example, P-type active region (or called "OD-P"), the second active region 212 is, for example, P-type active region, the third active region 213 is, for example, N-type active region, and the fourth active region 214 is, for example, N-type active region (or called "OD-N"). At least one of the first active region 211, the second active region 212, the third active region 213 and the fourth active region 214 may be defined as a PPNN structure, a STD cell and/or a NPN structure.

As illustrated in FIG. 2B, the first active region 211 and the second active region 212 includes a plurality of first sheets SH1, the dielectric wall 220 may extend to a position corresponding to the topmost sheet SH1'. Each first sheet SH1 has a first sheet width $W_{SH1}$ ranging, for example, between 15 nm and 30 nm. The second space SP2 has a space width $W_{SP}$ ranging, for example, between 40 nm and 60 nm. The dielectric wall 220 has a wall width W 220 ranging, for example, between ($W_{SP}$−20 nm) and $W_{SP}$.

As illustrated in FIG. 2C, for better performance, adjacent two sheets may be merged as one merged sheet. For example, each sheet of the first active region 211 and the corresponding sheet of the adjacent second active region 212 may be merged as one merged sheet $SH_M$. Each merged sheet $SH_M$ has a merged width $W_{SHM}$ ranging, for example, between 50 nm and 80 nm. In addition, for better performance, the sheet may be widened directly. For example, the third active region 213 further includes at least one third sheet SH3 which is directly-widen, each third sheets SH3 has a sheet width $W_{SH3}$ ranging, for example, between 20 nm and 50 nm.

Figure 3A:
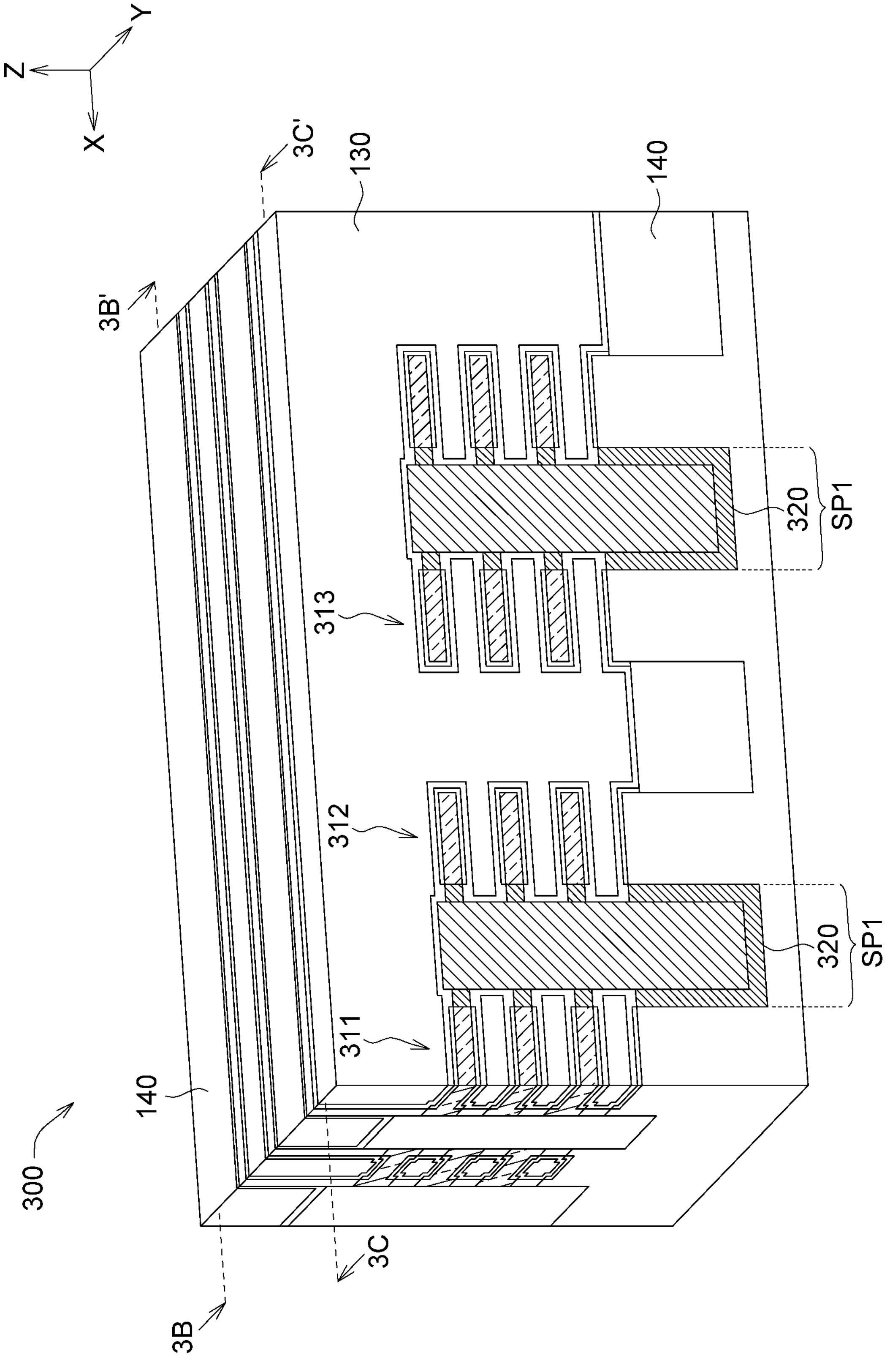
FIG. 3A illustrates a schematic diagram of a semiconductor device according to an embodiment of the present disclosure.
Figure 3B:
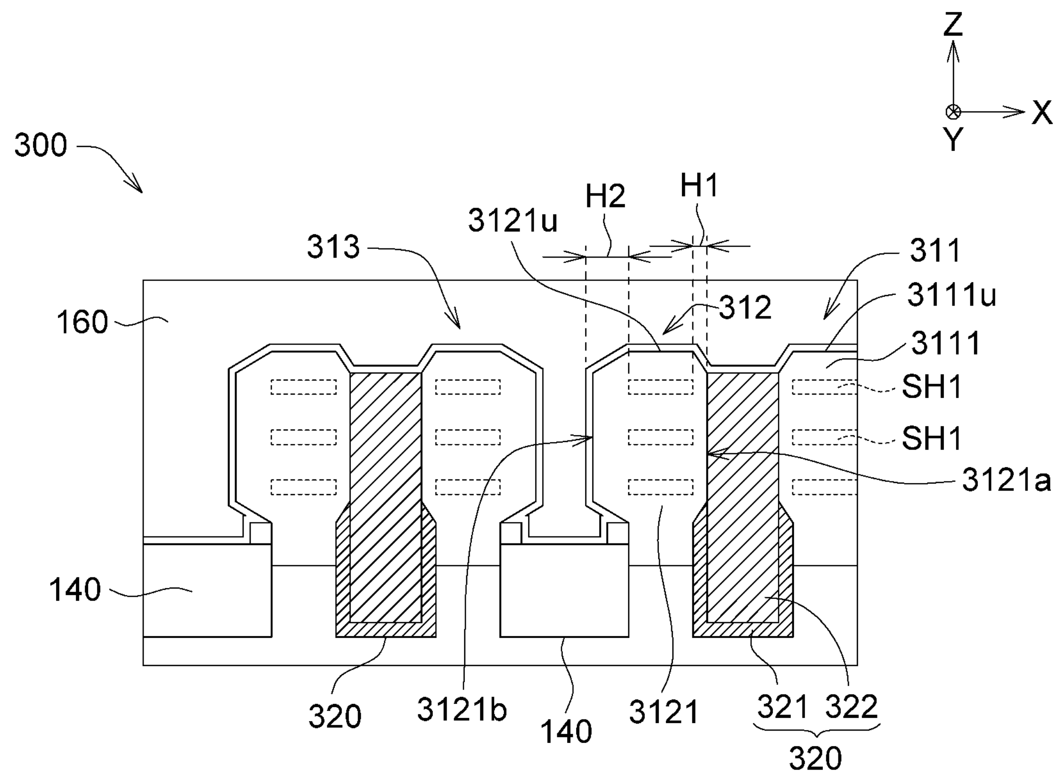
FIG. 3B illustrates cross-sectional view of the semiconductor device of FIG. 3A along a direction 3B-3B'.
Figure 3C:
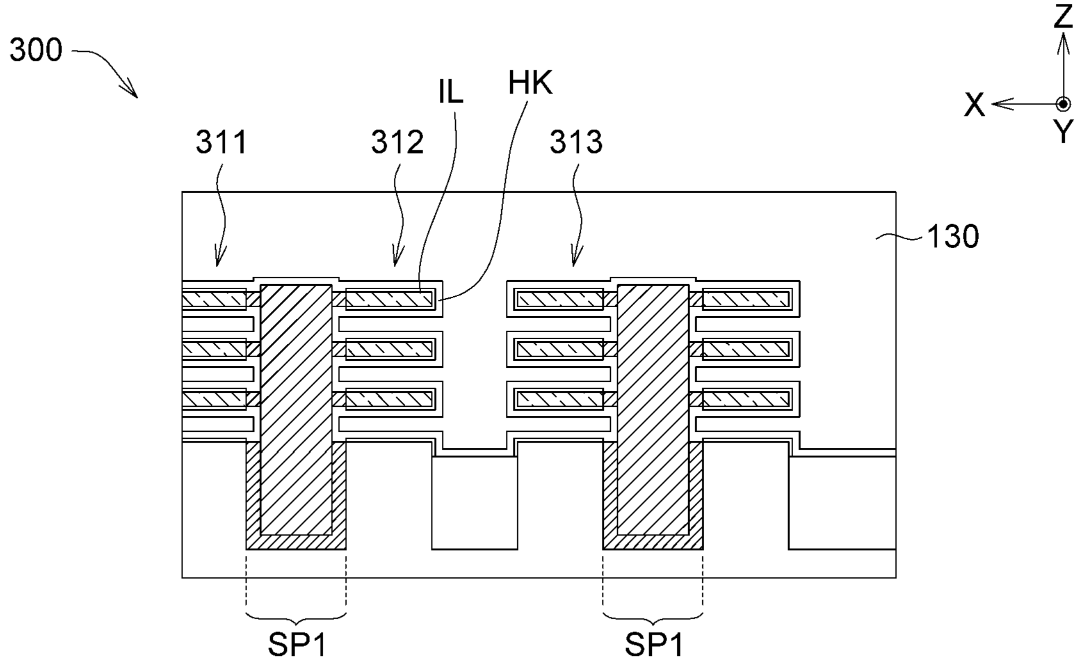
FIG. 3C illustrates cross-sectional view of the semiconductor device of FIG. 3A along a direction 3C-3C'.

Referring to FIGS. 3A to 3C, FIG. 3A illustrates a schematic diagram of a semiconductor device 300 according to an embodiment of the present disclosure, FIG. 3B illustrates cross-sectional view of the semiconductor device 300 of FIG. 3A along a direction 3B-3B', and FIG. 3C illustrates cross-sectional view of the semiconductor device 300 of FIG. 3A along a direction 3C-3C'. The viewed side of the structure of FIG. 3A is called "gate side".

As illustrated in FIGS. 3A and 3C, the semiconductor device 300 includes a plurality of active regions, such as a first active region 311, a second active region 312 and a third active region 313, and at least one dielectric wall 320, at least one metal gates 130 and at least one oxide layer 140. The second active region 312 is disposed adjacent to the first active region 311, wherein there is the first space SP1 between the first active region 311 and the second active region 312, and there is no jog within the first space SP1. The dielectric wall 320 is formed within the first space SP1 between the first active region 311 and the second active region 312. Due to there being no jog within the first space SP1, the dielectric wall 320 may fill up the first space SP1. The dielectric wall 320 includes the structure and/or material the same as or similar to that of the dielectric wall 120, and the similarities will not be repeated here.

As illustrated in FIG. 3B, the first active region 311 includes at least one first source/drain epitaxy (S/D EPI) 3111 having a first end surface 3111*u*, the second active region 312 includes at least one second source/drain epitaxy 3121 having a second end surface 3121*u*, the first source/drain epitaxy 3111 and the second source/drain epitaxy 3121 are disposed on adjacent two sides of the dielectric wall 320, and the dielectric wall 320 extends close to the first end surface 3111*u* and the second end surface 3121*u*. The first active region 3111 further includes a plurality of the first sheets SH1, the dielectric wall 320 extends to a position corresponding to the topmost sheet SH1'. The first source/drain epitaxy 3111 has a first lateral surface 3121*a* and a second lateral surface 3121*b* opposite to the first lateral surface 3121*a*. The first lateral surface 3121*a* faces the dielectric wall 320. In comparison with omitting the dielectric wall 320, a distance H1 between the first lateral surface 3121*a* and the first sheet SH1 is reduced due to the block of the dielectric wall 320. As a result, the capacitance of gate-to-drain (Co) may be reduced to boost device performance. Due to the second lateral surface 3121*b* being not blocked by the dielectric wall 320, a distance H2 between the second lateral surface 3121*b* and the first sheet SH1 is greater than the first distance H1. In an embodiment, the distance H1 may range between 0 and 10 nm, for example, while the distance H2 ranges between 10 nm and 20 nm.

Figure 4A:
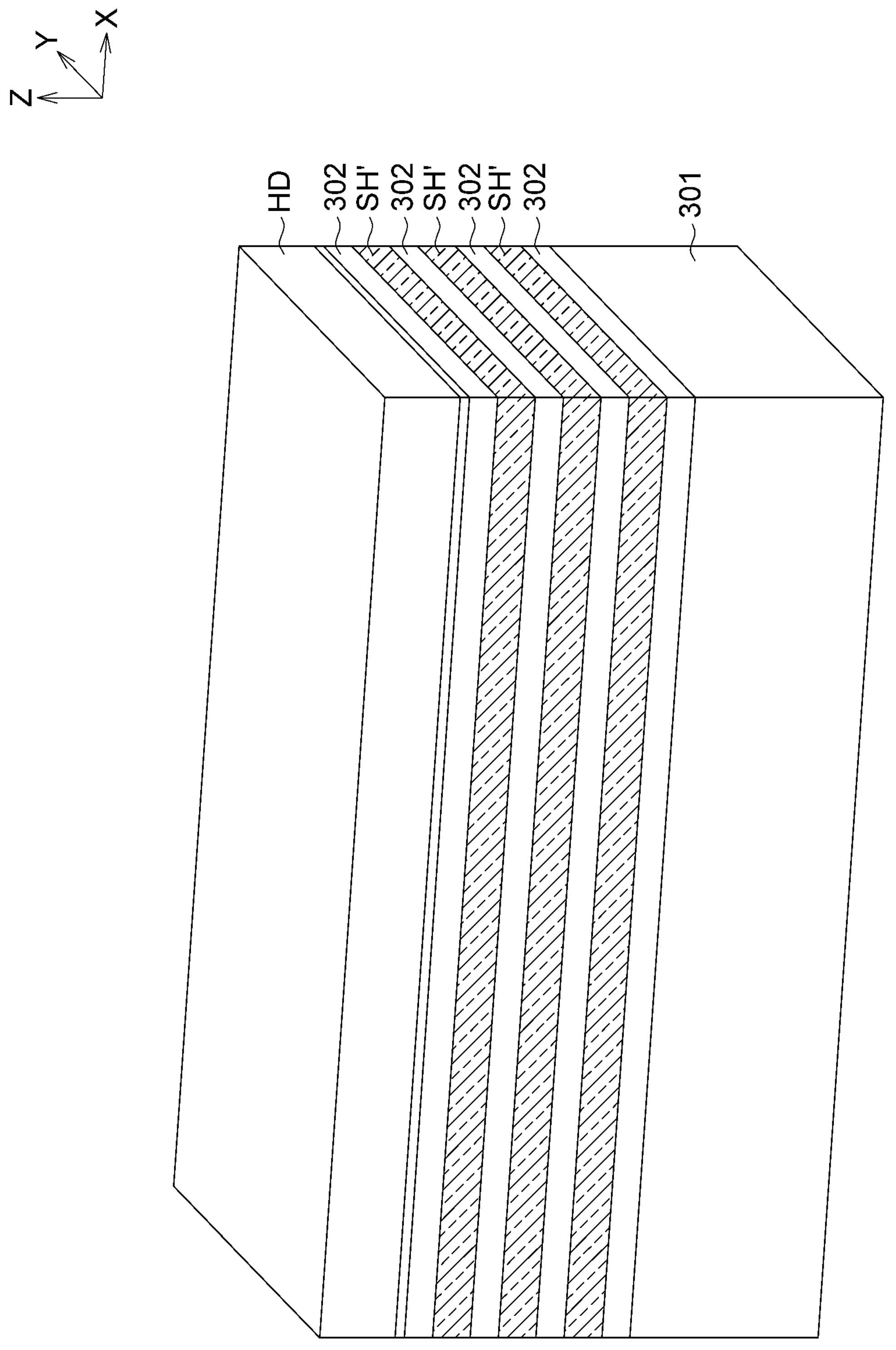
FIGS. 4A to 4O illustrate schematic diagrams of manufacturing processes of the semiconductor device of FIG. 3A.
Figure 4B:
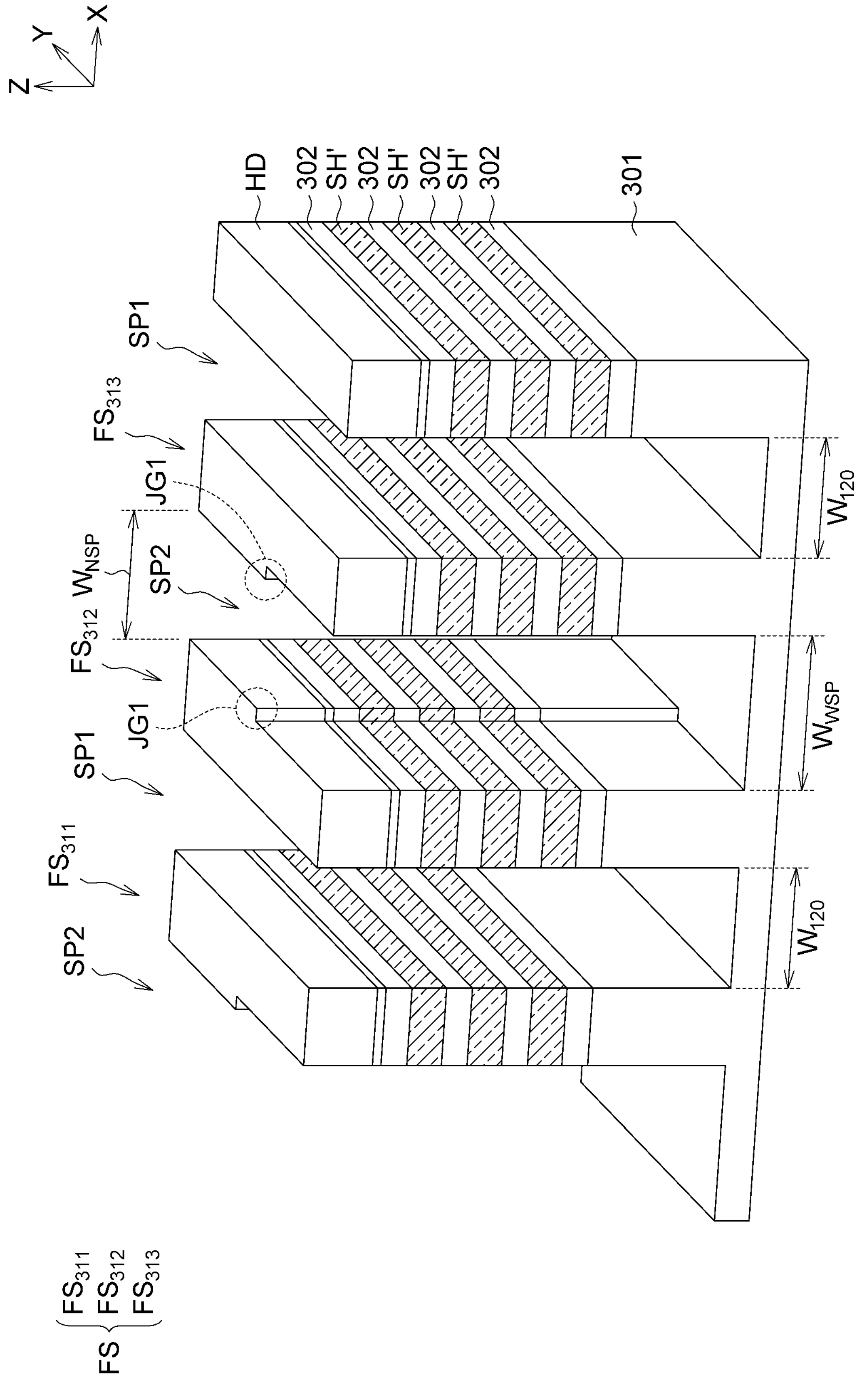
Figure 4C:
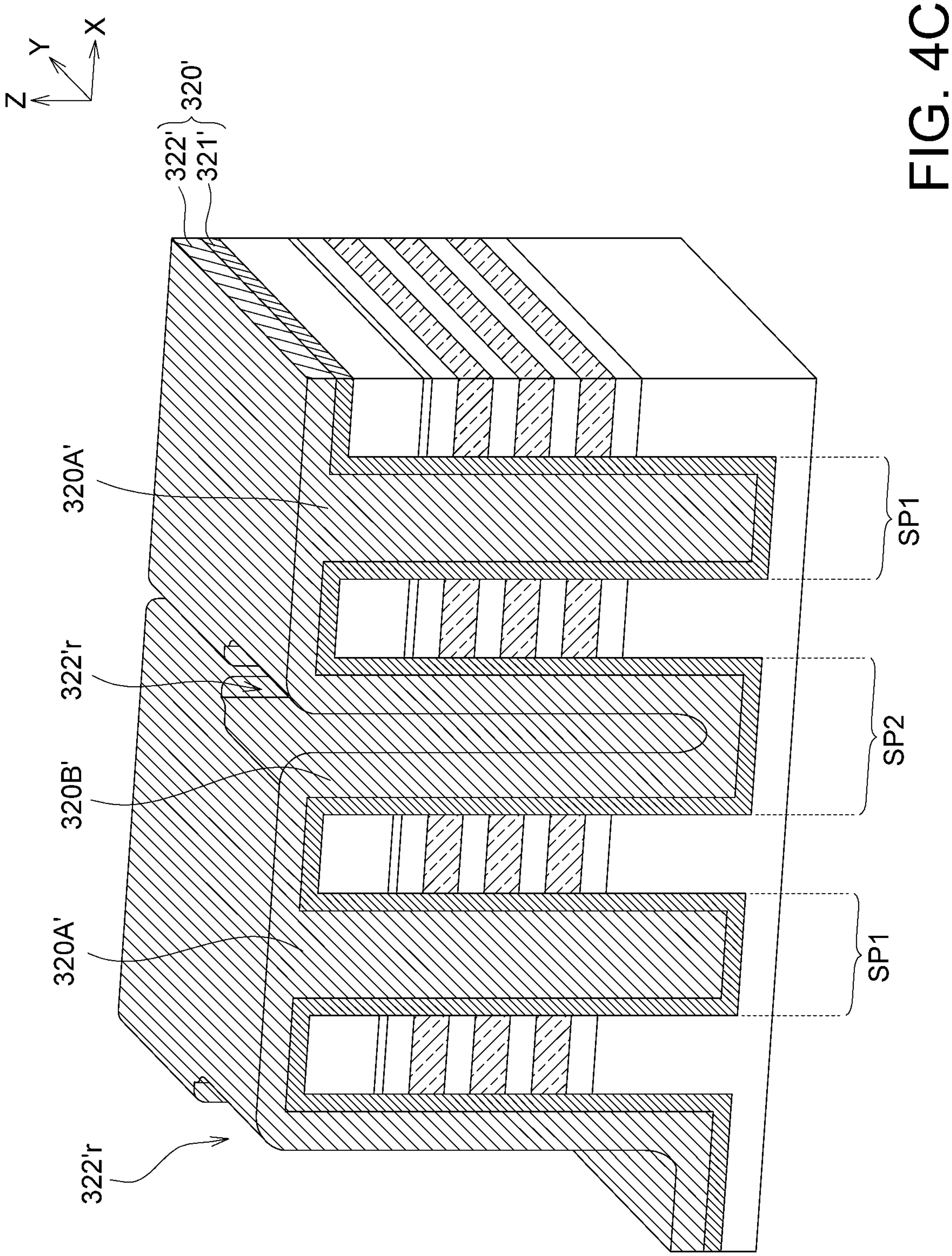
Figure 4D:
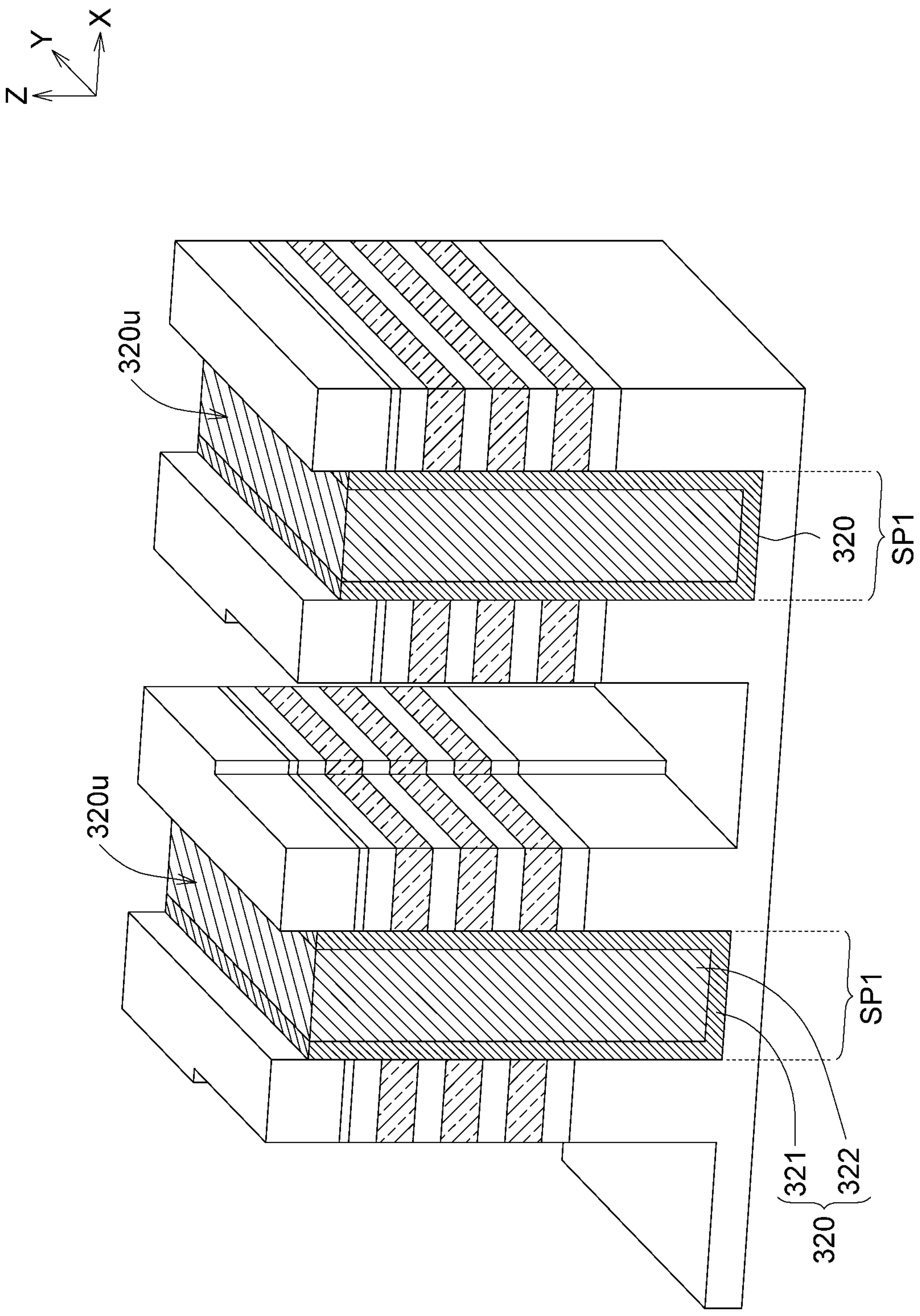
Figure 4E:
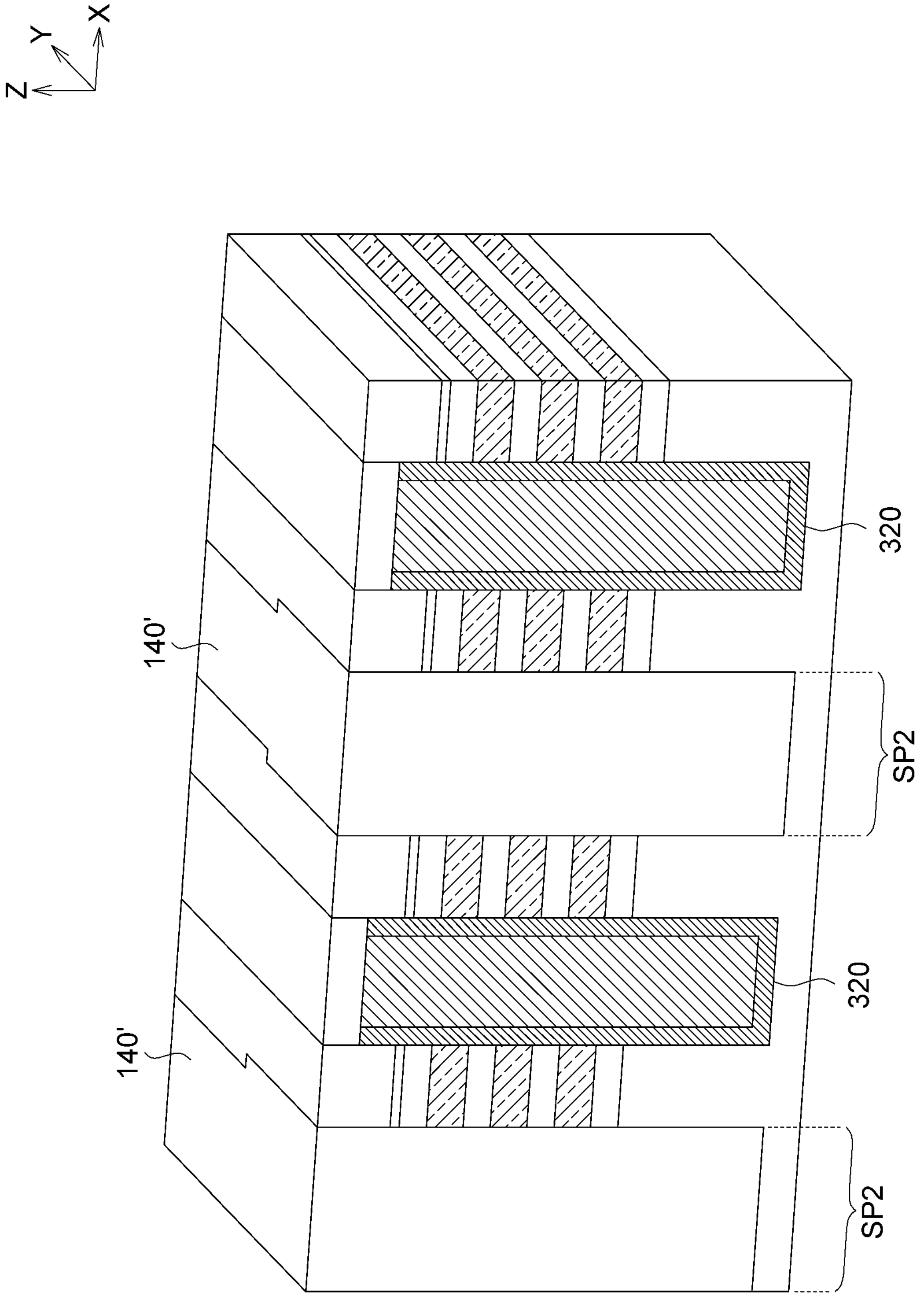
Figure 4F:
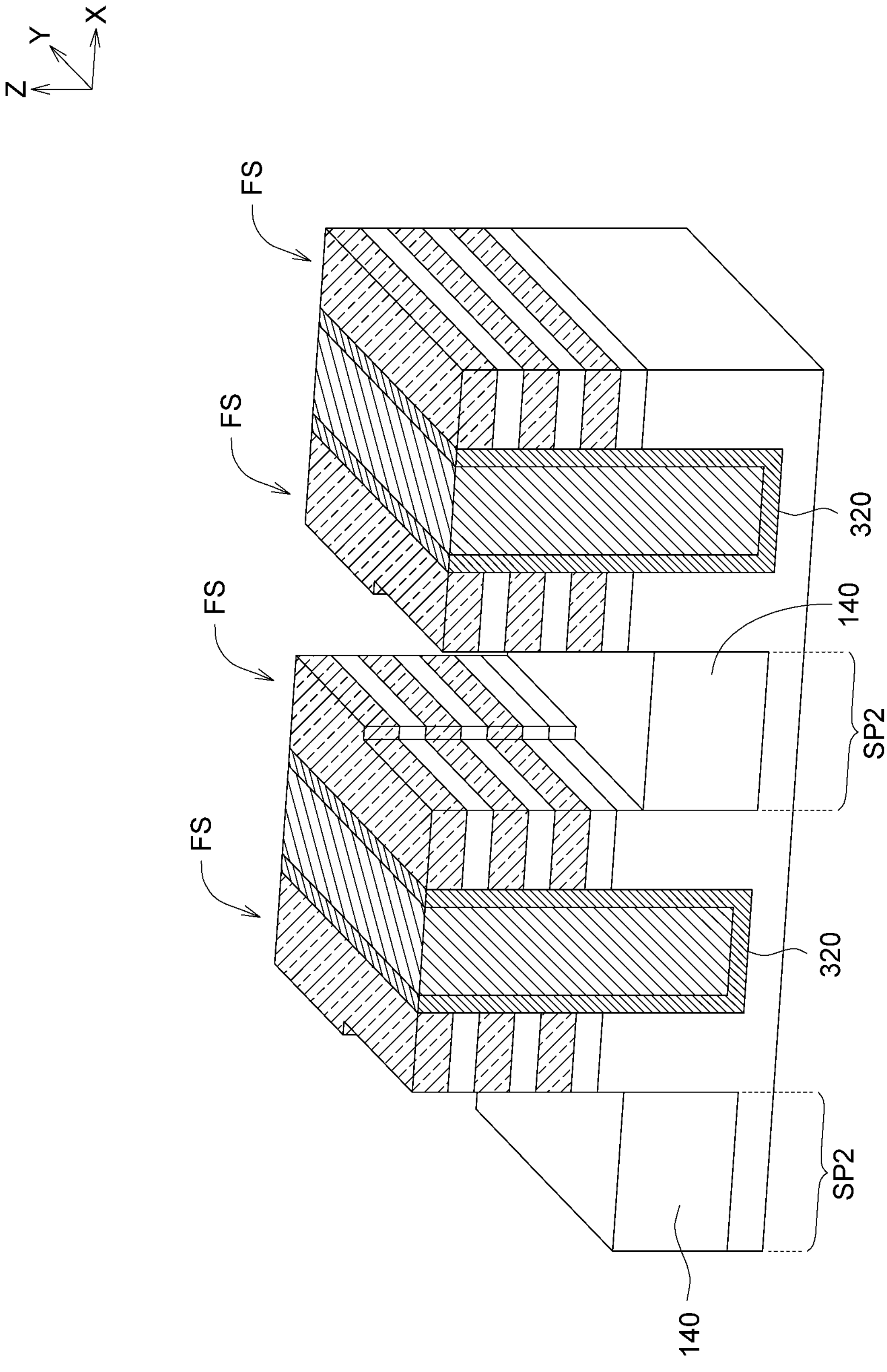
Figure 4G:
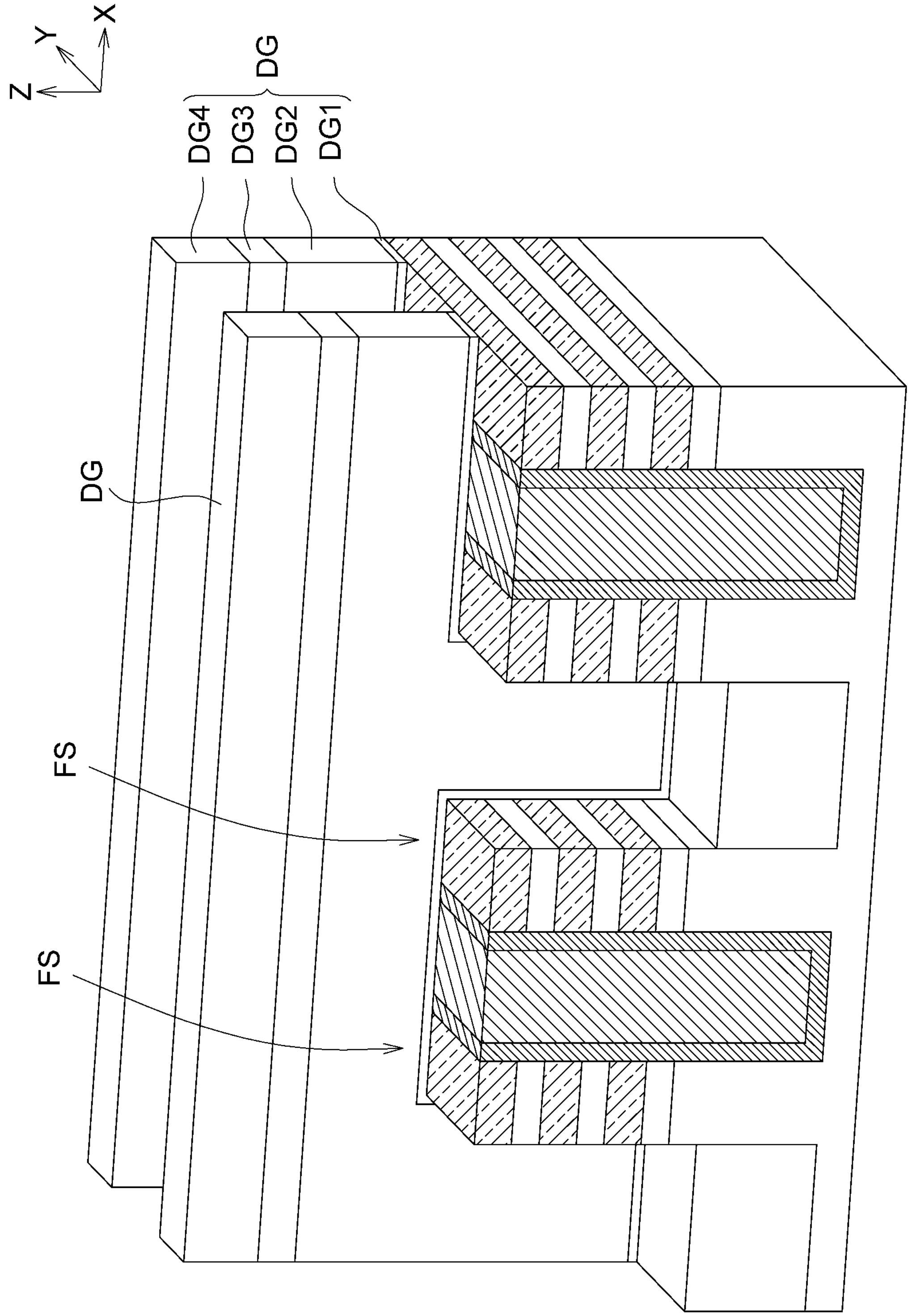
Figure 4H:
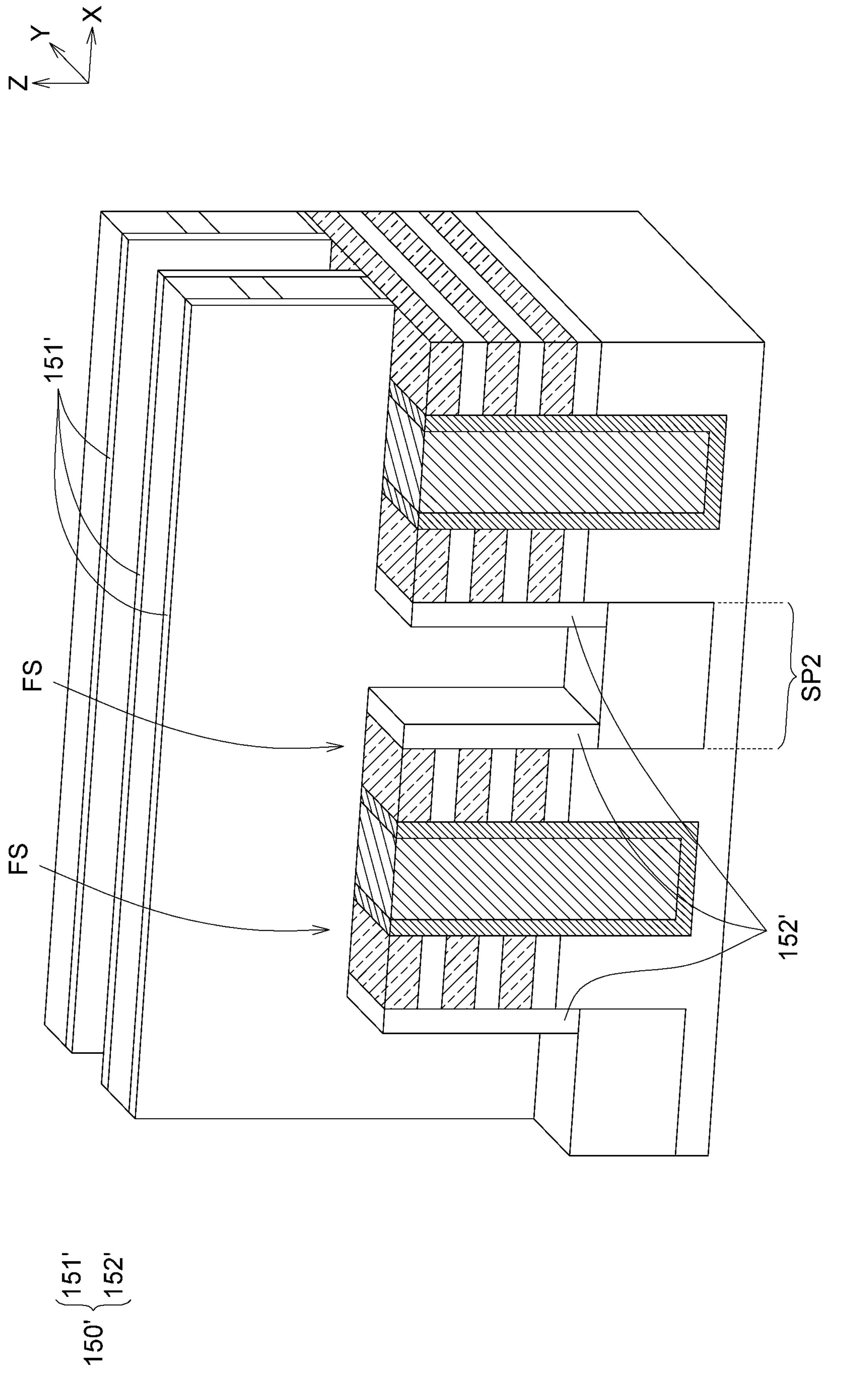
Figure 4I:
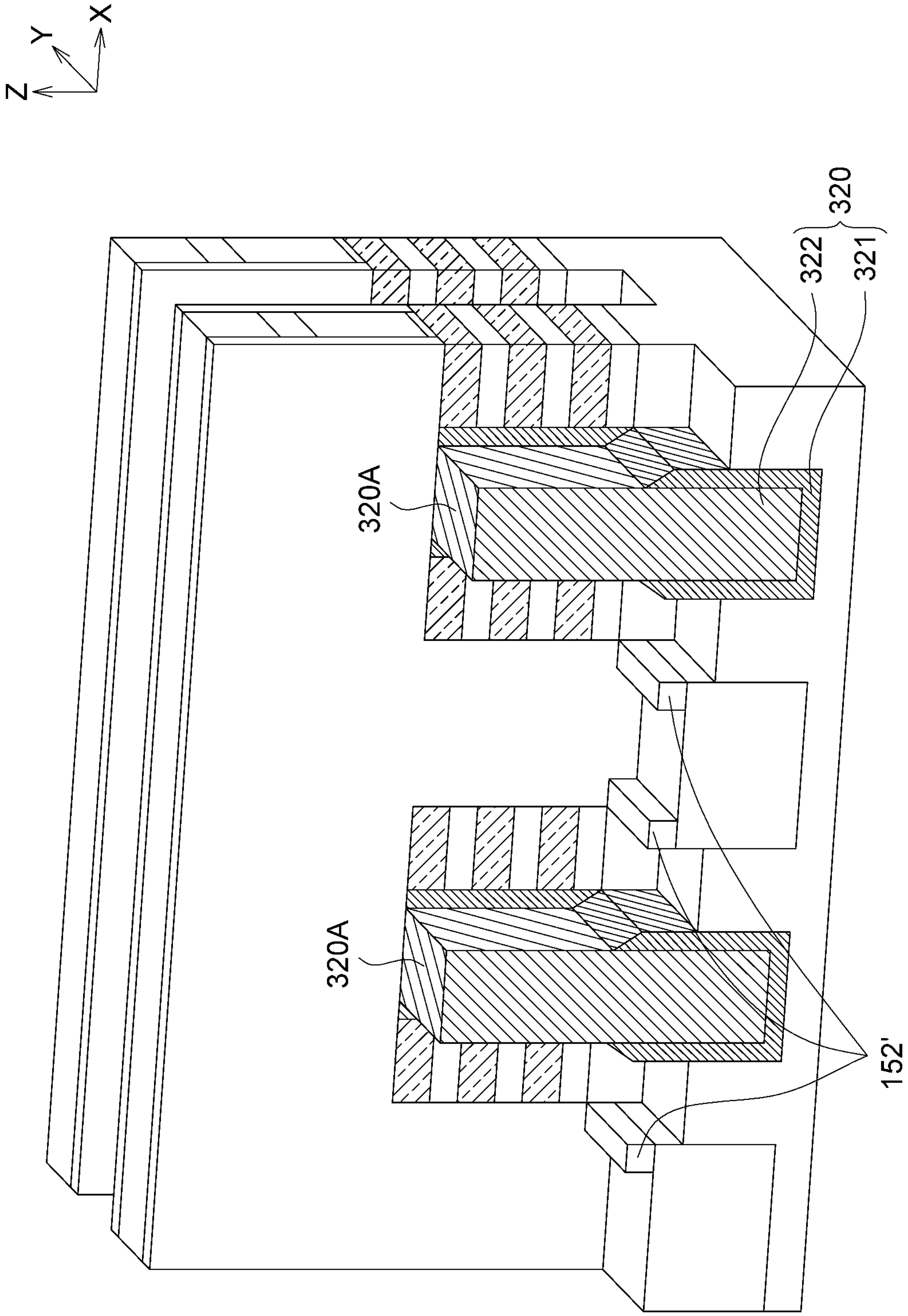
Figure 4J:
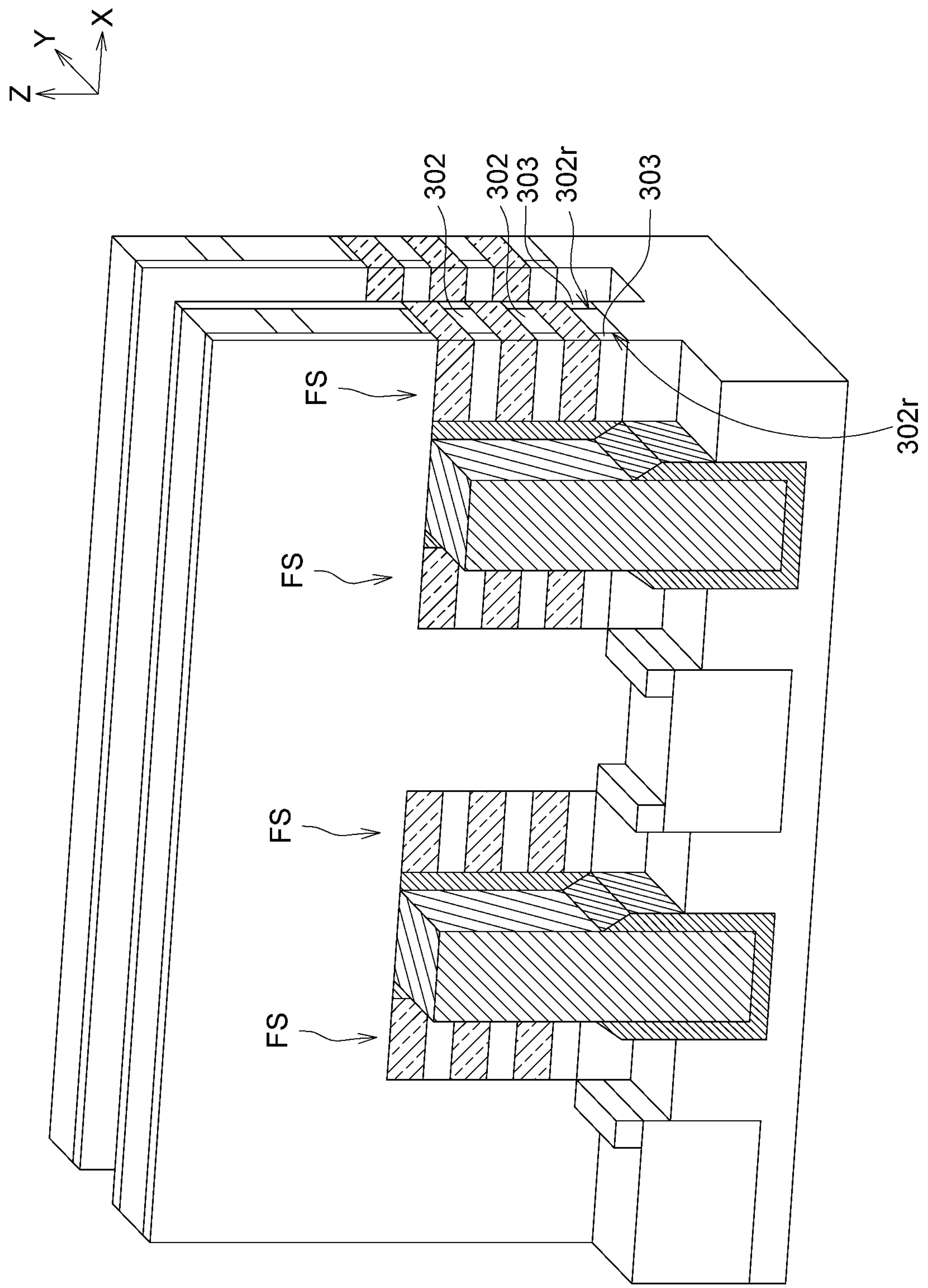
Figure 4K:
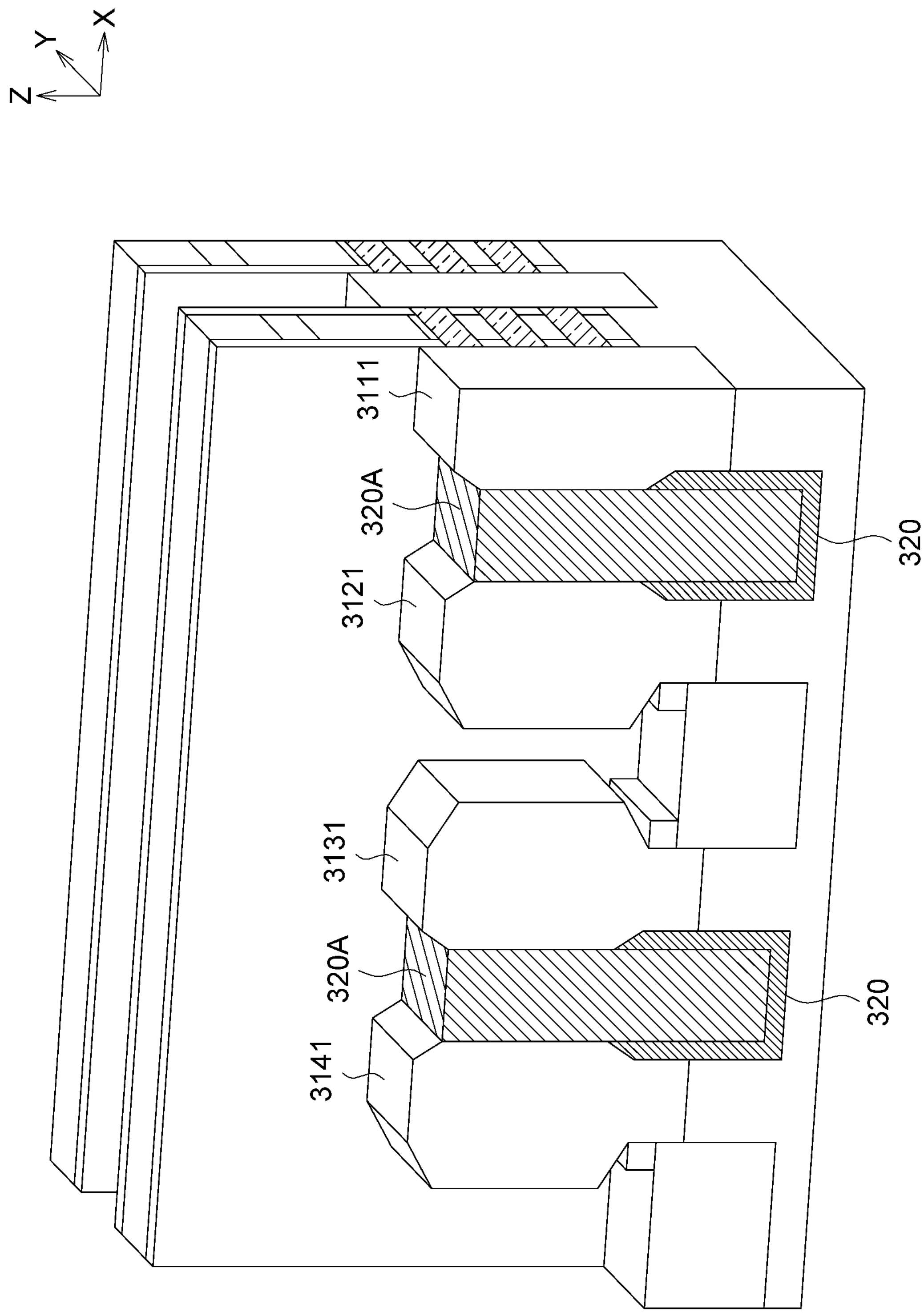
Figure 4L:
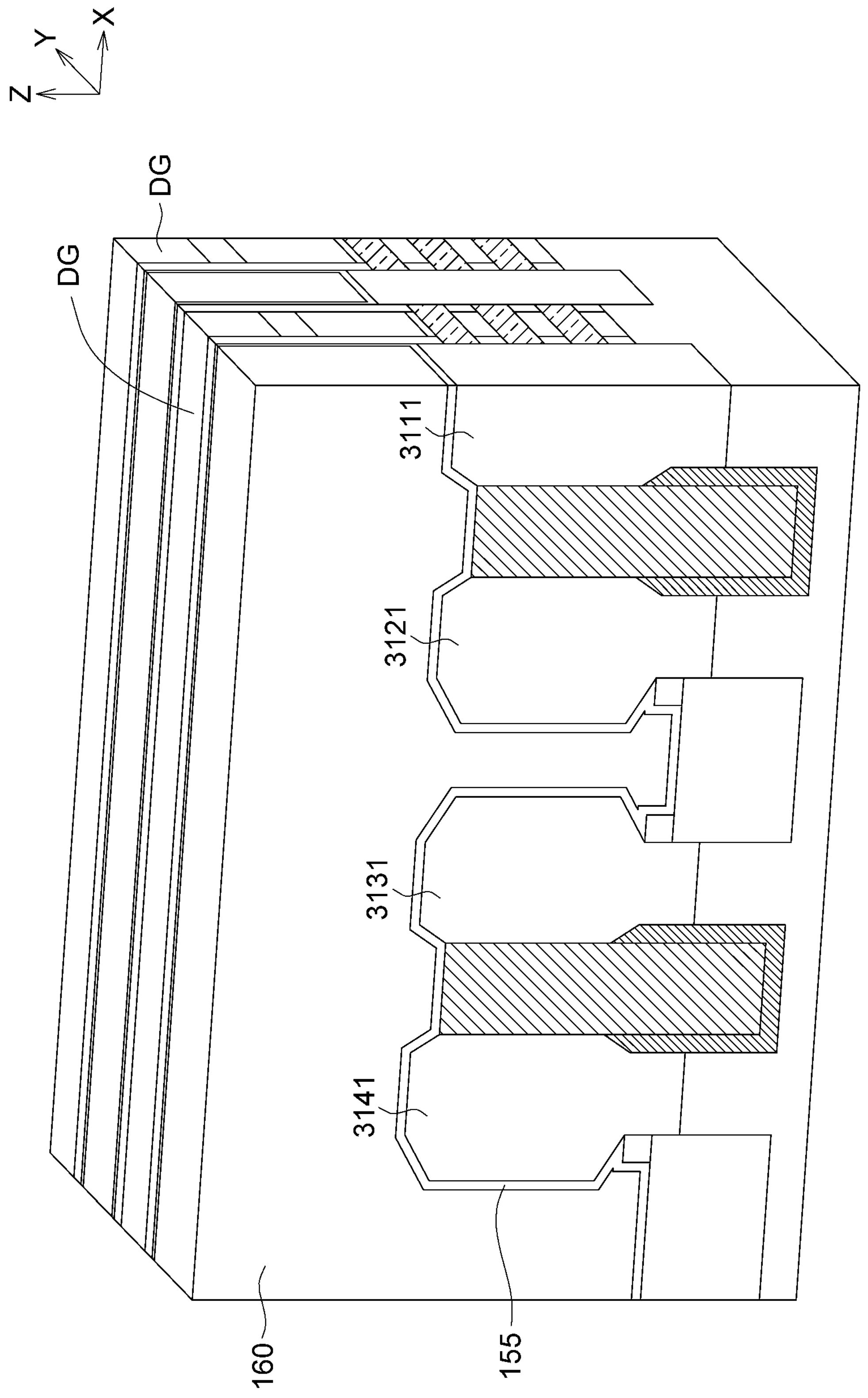
Figure 4M:
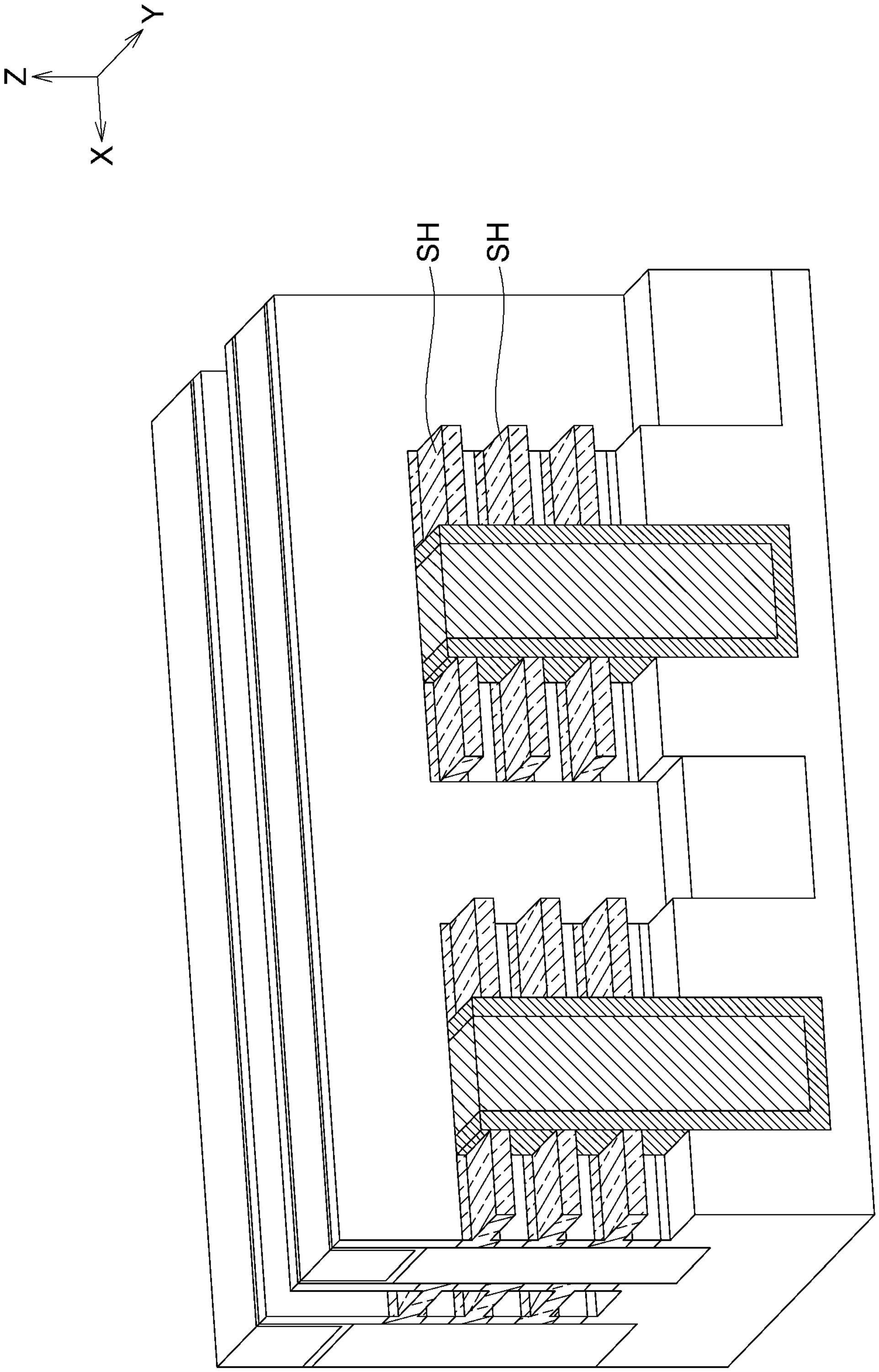
Figure 4N:
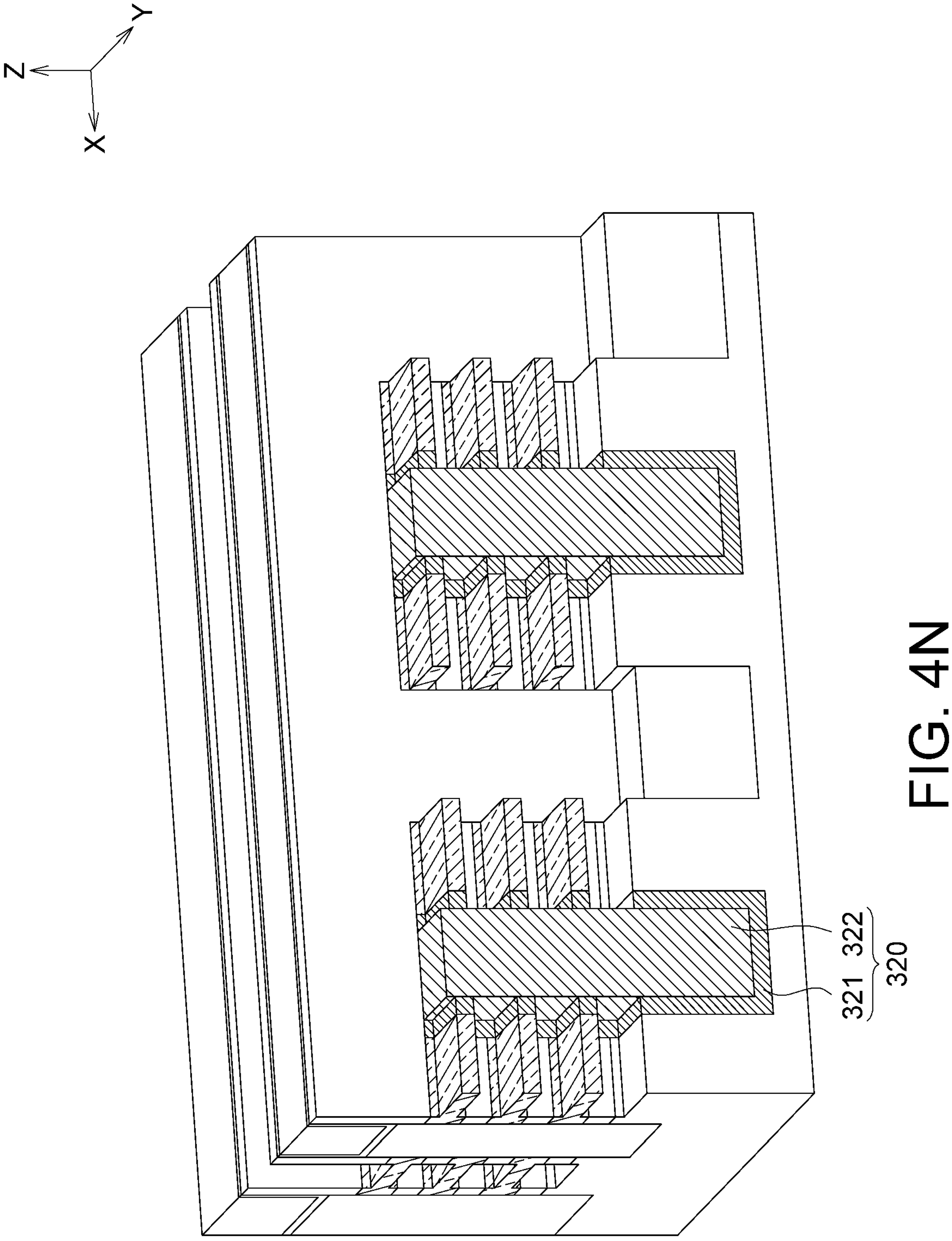
Figure 4O:
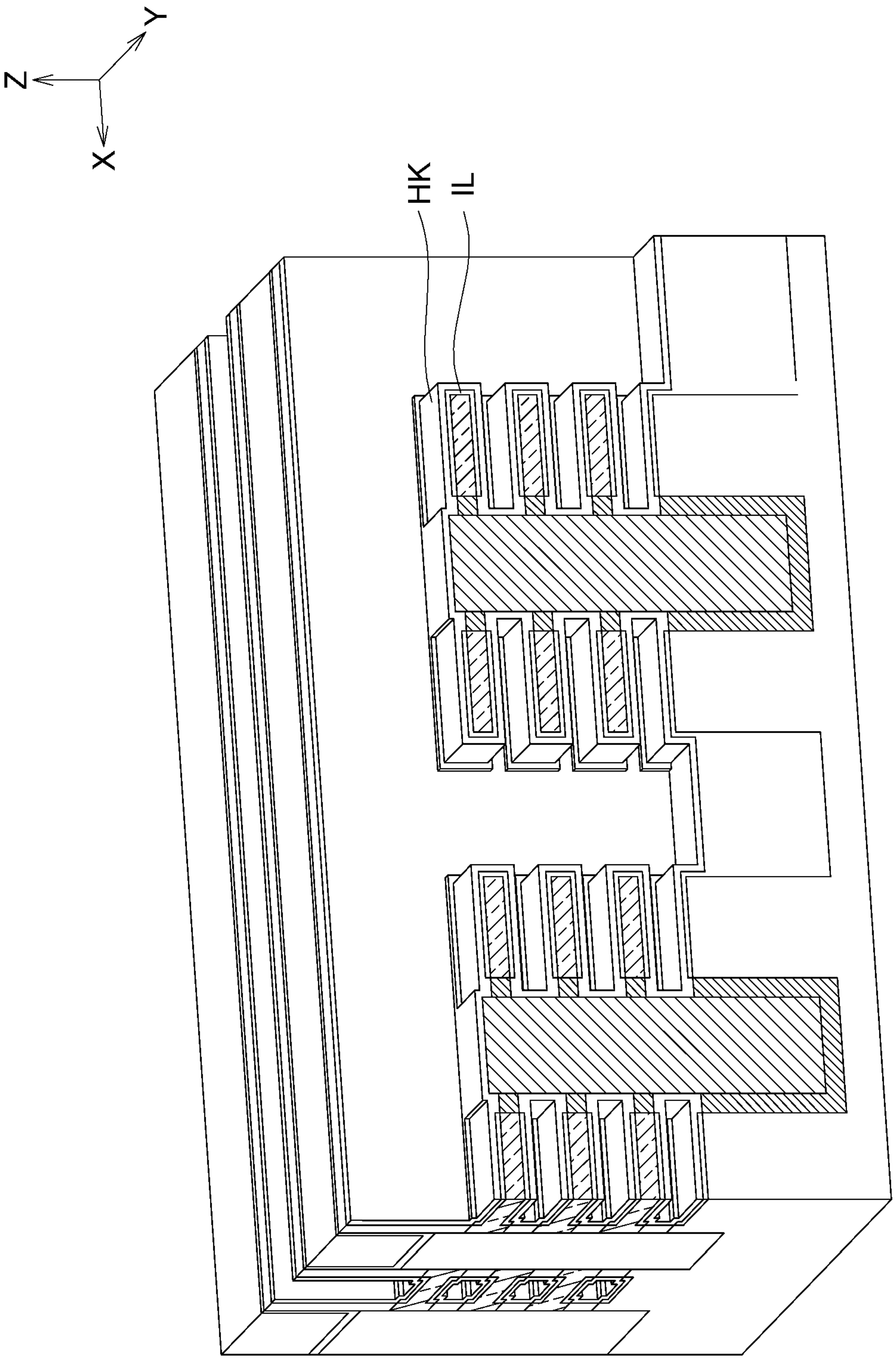

Referring to FIGS. 4A to 4O, FIGS. 4A to 4O illustrate schematic diagrams of manufacturing processes of the semiconductor device 300 of FIG. 3A. The manufacturing processes of the semiconductor device 100 and 200 include the processes the same as or similar to that of the semiconductor device 300, and it will not be repeated here.

As illustrated in FIG. 4A, a base 301, a plurality of sheet layers SH' and a plurality of spacer layers 302 over the base 301 and a hard mask HD over the spacer layers 302 are provided, wherein the adjacent two sheet layers SH' are spaced by one spacer layers 302, or the adjacent two spacer layers 302 are spaced by one sheet layers SH'. The base 301 may be formed of a material including, for example, silicon. The sheet layers SH' may be the semiconductor material to be used for the channels of the semiconductor device 300, and the spacer layer 302 may be a sacrificial layer which will be removed in subsequent process. The sheet layers SH' may be formed of a material including, for example, silicon, and the spacer layer 302 may be formed of a material including, for example, silicon germanium.

As illustrated in FIG. 4B, a portion of each sheet layer SH', a portion of each spacer layers 302 and a portion of the base 301 are removed through the patterned hard mask HD by using etching, for example. A remaining portion of each spacer layer SH' and a remaining portion of each spacer layers 302 form a plurality of fin structures FS, for example, a first fin structure $FS_{311}$, a second fin structure $FS_{312}$ and a third fin structure $FS_{313}$. The region of one fin structure FS defines one active region (or one OD region), for example. There is the first space SP1 between the first fin structure $FS_{311}$ and the second fin structure $FS_{312}$, and there is the second space SP2 between the second fin structure $FS_{312}$ and the third fin structure $FS_{313}$. Due to there being at least one jop JG1 formed within the second space SP2, the second space SP2 has the narrower width $W_{NSP}$ and the wider width $W_{WSP}$ greater than the narrower width $W_{NSP}$. The first space SP1 has the wall width $W_{120}$ less than the narrower width $W_{NSP}$. In another embodiment, by changing design of the jop JG1, the second space SP2 may have the same width in different positions.

As illustrated in FIG. 4C, a dielectric wall material 320' covering the fin structures FS is formed by using, for example, deposition, wherein the dielectric wall material 320' includes at least one first material portion 320A' within the corresponding first space SP1 and at least one second material portion 320B' within the corresponding second space SP2. In the present embodiment, the dielectric wall material 320' is multi-layered structure. Furthermore, the dielectric wall material 320' may include a shell layer 321' and a core layer 322', wherein the shell layer 321' is formed on sidewalls of the fin structures FS, and the core layer 322' formed on sidewalls of the shell layer 321'. Due to the wider width $W_{WSP}$ (the wider width $W_{WSP}$ is illustrated in FIG. 4B) being greater than the narrower width $W_{NSP}$ (the narrower width $W_{NSP}$ is illustrated in FIG. 4B), the second material portion 320B' does not fill up the remaining second space SP2 to form a recess 322'*r* corresponding to the region of the wider width $W_{WSP}$ of FIG. 4B. Due to the narrower width $W_{NSP}$ being less than the wider width $W_{WSP}$, the core layer 322' may fill up the region of the narrower width $W_{NSP}$ of FIG. 4B.

In another embodiment, the dielectric wall material 320' may be a single-layered structure, for example, one of the shell layer 321' and the core layer 322'. In addition, the shell layer 321' may be formed of a material including, for example, SiOC and/or SiOCN, while the core layer 322' may be formed of a material including, for example, SiN and/or SiCN. In another embodiment, the shell layer 321' may be formed of a material including, for example, SiN and/or SiCN, while the core layer 322' may be formed of a material including, for example, SiOC and/or SiOCN. In addition, the shell layer 321' has a thickness ranging, for example, between 2 nm to 6 nm.

As illustrated in FIG. 4D, a portion of the dielectric wall material 320' is removed by using, for example, etching back. For example, a portion of the first material portion 320A' of FIG. 4C and the entire of the second material portion 320B' of FIG. 4C re removed. A remaining portion of the first material portion 320A' forms at least one dielectric wall 320 formed within the first space SP1, wherein the dielectric wall 320 includes a first sub-dielectric wall 321 formed on a sidewall of the first space SP1 and a second sub-dielectric wall 322 formed on the first sub-dielectric wall 321 and filling up the remained first space SP1. The dielectric wall 320 fully fills up at least one portion of the first space SP1. The dielectric wall 320 has a top surface 320*u* which has no recess, or the top surface 320*u* is plane without recess. In addition, due to the second material portion 320B' within the second space SP2 having the recess 322'*r*, the volume of the second material portion 320B' of FIG. 4C within the second space SP2 is reduced, and thus the second material portion 320B' within the second space SP2 may be completely removed after etching.

As illustrated in FIG. 4E, at least one oxide layer material 140' is formed within the second space SP2 and on the dielectric wall 320 within the first space SP1 by using, for example, deposition. The oxide layer material 140' is, for example, a STI (Shallow Trench Isolation).

As illustrated in FIG. 4F, the hard mask HD, a portion of the oxide layer material 140', a portion of the fin structure FS, a portion of the dielectric wall 320 are removed by using, for example, a Chemical-Mechanical Polishing (CMP). Then, a portion of the oxide layer material 140' within the second space SP2 is removed by using, for example, etching back, and a remaining portion of the oxide layer material 140' forms at least one oxide layer 140.

As illustrated in FIG. 4G, at least one dummy gate structure DG is formed on the fin structures FS. The dummy gate structure DG may cover or surround the OD jog to avoid failure of the epitaxial growth. The dummy gate structure DG includes a dummy dielectric layer DG1, a dummy gate layer DG2, a mask layer DG3 and an oxide layer DG4. The dummy dielectric layer DG1 is formed on the fin structures FS. The dummy dielectric layer DG1 is formed of a material including, for example, silicon oxide, silicon nitride, a combination thereof, or the like, and may be deposited or thermally grown according to acceptable techniques. The dummy gate layer DG2 is formed over the dummy dielectric layer DG1, and the mask layer DG3 is formed over the dummy gate layer DG2. The dummy gate layer DG2 may be deposited over the dummy dielectric layer DG1 and then planarized, such as by CMP. The mask layer DG3 may be deposited over the dummy gate layer DG2. The dummy gate layer DG2 may be a conductive or non-conductive material and may be selected from a group including amorphous silicon, polycrystalline-silicon (poly-silicon), poly-crystalline silicon-germanium (poly-SiGe), metallic nitrides, metallic silicides, metallic oxides, and metals. The dummy gate layer DG2 may be deposited by physical vapor deposition (PVD), CVD, sputter deposition, or other techniques for depositing the selected material. The dummy gate layer DG2 may be formed of other materials that have a high etching selectivity from the etching of isolation regions. The mask layer DG3 may include, for example, silicon nitride, silicon oxynitride, or the like.

As illustrated in FIG. 4H, a spacer layer material 150' is formed on sidewalls of the dummy gate structures DG and sidewalls of the fin structures FS by using, for example, deposition, etching, etc. The spacer layer material 150' includes a first spacer material 151' and a second spacer material 152', wherein the first spacer material 151' covers the sidewalls the dummy gate structures DG, and the second spacer material 152' covers the sidewalls of the fin structures FS. The spacer layer material 150' could be a single-layer structure or a multi-layer structure, and may be formed of a dielectric material including, for example, silicon oxide, silicon nitride, silicon carbide, silicon oxynitride, silicon oxycarbide, other suitable materials, or a combination thereof. The spacer layer material 150' may be formed by depositing a dielectric material on the dummy gate structure DG and then a portion of the dielectric material is removed by an anisotropic etching process (for example, dry etching process), wherein a remaining portion of the dielectric material forms the spacer layer material 150'.

As illustrated in FIG. 4I, a portion of the fin structure FS in a defined source/drain region is removed by, for example, etching, and a portion of the dielectric wall 320 (for example, a portion of the first sub-dielectric wall 321 and/or a portion of the second sub-dielectric wall 322) is removed by, for example, etching, wherein a remaining portion of the dielectric wall 320 forms an epitaxy stop portion 320A, and the epitaxy stop portion 320A may block the growth of the subsequently formed source/drain epitaxy for limiting the size (for example, width in X-axis) of the subsequently formed source/drain epitaxy. A portion of the second spacer material 152' is removed by, for example, etching, for sparing a growth space for source/drain epitaxy.

As illustrated in FIG. 4J, a plurality of recesses 302*r* are formed on the spacer layers 302 by using, for example, etching and then a plurality of inner spacer 303 is formed within the recesses 302*r*. The spacer layer material 150' may be formed of a material the same as or similar to that of the spacer layer material 150'.

As illustrated in FIG. 4K, a plurality of the first source/drain epitaxies 311 and a plurality of the second source/drain epitaxies 312 are formed on the fin structures FS exposed from the defined source/drain regions. Due to the epitaxy stop portion 320A of the dielectric wall 320, the source/drain width $W_{S/D}$ could be reduced.

As illustrated in FIG. 4K, the first source/drain epitaxy 3111, the second source/drain epitaxy 3121, the third source/drain epitaxy 3131 and the fourth source/drain epitaxy 3141 are formed on the fin structures FS exposed from the defined source/drain regions by using epitaxial growth. Due to the block of the epitaxy stop portion 320A, the size (for example, width in X-axis) of the source/drain epitaxy could be reduced.

As illustrated in FIG. 4L, a contact etching stop layer (CESL) 155 over the first source/drain epitaxy 3111, the second source/drain epitaxy 3121, the third source/drain epitaxy 3131 and the fourth source/drain epitaxy 3141 is formed by using, for example, deposition, such as chemical vapor deposition (CVD), Plasma-Enhanced Chemical Vapor Deposition (PECVD), ALD (atomic layer deposition), or the like. The CESL 155 may be formed of a material including, for example, a dielectric material, such as silicon nitride, silicon oxide, silicon oxynitride, or the like.

Then, an interlayer dielectric (ILD) 160 covering the CESL 155 is formed by using, for example, deposition, such as CVD, PECVD, or flowable chemical vapor deposition (FCVD), or the like. The ILD 160 may be formed of a dielectric including, for example, phospho-silicate glass (PSG), boro-silicate glass (BSG), boron-doped phospho-silicate glass (BPSG), undoped silicate glass (USG), or the like. Other insulation materials formed by any acceptable process may be used.

The viewed side of the structure of FIG. 4L is called "source/drain side", while the viewed side of the structure of FIG. 4M is called "gate side".

As illustrated in FIG. 4M, the dummy gate structures DG of FIG. 4L are removed by using, for example, an anisotropic dry etch process. Furthermore, the etching process could include a dry etch process using reaction gas(es) that selectively etch the dummy gate structures DG at a faster rate than the first ILD 160. In an embodiment, before the removal, a helmet (not illustrated) may be formed on the first ILD 160, by using for example, etching/deposition, to block the removal for the dummy gate structures DG. In addition, the spacer layers 302 also be removed by using, for example, etching. After the dummy gate structures DG and the spacer layers 302 are removed, the sheets SH are exposed (or formed).

As illustrated in FIG. 4N, a portion of the dielectric wall 320 is removed by using, for example, etching. Furthermore, a portion of the first sub-dielectric wall 321 between the adjacent two sheets SH is removed to expose the second sub-dielectric wall 322. Due to the material of the first sub-dielectric wall 321 being different from that of the second sub-dielectric wall 322, the removed depth (in X-axis) may be well controlled to stop at the second sub-dielectric wall 322.

As illustrated in FIG. 4O, at least one interface layer IL is formed on the sheets SH by using, for example, deposition. The High-k gate dielectric layer HK over the fin structures FS is formed by using, for example, deposition.

Then, at least one metal gate 130 over the fin structures FS is formed by using, for example, deposition, as illustrated in FIG. 3A. The metal gate 130 is formed around the sheets, and such structure is also called "Gate-All-Around (GAA) structure".

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

According to the present disclosure, a semiconductor device includes a plurality of active regions and a dielectric wall. The dielectric wall may fill up space between adjacent two active regions, and there is no jog (or step) within the space. Accordingly, the dielectric wall may fill up the space due to there being no jog within the space.

Example embodiment 1: a semiconductor device includes a first active region, a second active region and a dielectric wall. The second active region is disposed adjacent to the first active region, wherein there is a first space between the first active region and the second active region, and there is no jog within the first space. The dielectric wall is formed within the first space between the first active region and the second active region.

Example embodiment 2 based on Example embodiment 1: the first active region has a first lateral surface, the second active region has a second lateral surface opposite to the first lateral surface, and the first lateral surface and the second lateral surface continuously extend along single plane.

Example embodiment 3 based on Example embodiment 1: the semiconductor device further includes a third active region disposed adjacent to the second active region. There is a second space between the second active region and the third active region, and there is the jog between the second space.

Example embodiment 4 based on Example embodiment 1: the semiconductor device further includes a metal gate covering the jog.

Example embodiment 5 based on Example embodiment 1: the first active region includes a first source/drain epitaxy having a first end surface, the second active region includes a second source/drain epitaxy having a second end surface, the first source/drain epitaxy and the second source/drain epitaxy are disposed on adjacent two sides of the dielectric wall, and the dielectric wall extends close to the first end surface and the second end surface.

Example embodiment 6 based on Example embodiment 1: the first active region further includes a plurality of sheets, and the dielectric wall extends to a position corresponding to the topmost sheet.

Example embodiment 7 based on Example embodiment 1: the first active region and the second active region surround the dielectric wall.

Example embodiment 8 based on Example embodiment 1: the dielectric wall includes a shell layer and a core layer, wherein the shell layer covers a lateral sidewall of the first space, and the core layer fills up the remain first space.

Example embodiment 9 based on Example embodiment 1: the first space has a wall width, the second space has a narrower width and a wider width greater than the narrower width, and the wall width is less than the narrower width.

Example embodiment 10: a semiconductor device includes a first active region, a second active region and a dielectric wall. The second active region is disposed adjacent to the first active region, wherein there is a first space between the first active region and the second active region. The dielectric wall is formed within the first space and has a first sidewall and a second sidewall opposite to the first sidewall. The first sidewall and the second sidewall opposite to the first sidewall continuously extend along a direction.

Example embodiment 11 based on Example embodiment 10: the first active region has a first lateral surface, the second active region has a second lateral surface opposite to the first lateral surface, and the first lateral surface and the second lateral surface continuously extend along a plane.

Example embodiment 12 based on Example embodiment 10: the semiconductor device further includes a third active region disposed adjacent to the second active region. There is a second space between the second active region and the third active region, and there is the jog between the second space.

Example embodiment 13 based on Example embodiment 10: the first active region includes a first source/drain epitaxy having a first end surface, the second active region includes a second source/drain epitaxy having a second end surface, the first source/drain epitaxy and the second source/drain epitaxy are disposed on adjacent two sides of the dielectric wall, and the dielectric wall extends close to the first end surface and the second end surface.

Example embodiment 14 based on Example embodiment 10: the first active region further includes a plurality of sheets, and the dielectric wall extends to a position corresponding to the topmost sheet.

Example embodiment 15 based on Example embodiment 10: the first active region and the second active region surround the dielectric wall.

Example embodiment 16 based on Example embodiment 10: the dielectric wall includes a shell layer and a core layer, the shell layer covers a lateral sidewall of the first space, and the core layer fills up the remain first space.

Example embodiment 17 based on Example embodiment 10: the first space has a wall width, the second space has a narrower width and a wider width greater than the narrower width, and the wall width is less than the narrower width.

Example embodiment 18: a manufacturing method of a semiconductor device includes the following steps: forming a first fin structure and a second fin structure adjacent to the first fin structure, wherein there is a first space between the first fin structure and the second fin structure, and there is no jog within the first space; and forming a dielectric wall within the first space between the first fin structure and the second fin structure.

Example embodiment 19 based on Example embodiment 18: the manufacturing method further includes: forming a third fin structure adjacent to the second fin structure, wherein there is a second space between the second fin structure and the third fin structure; forming a dielectric wall material within the first space and the second space, wherein the dielectric wall material comprises a first material portion within the first space and a second material portion within the second space; and removing a portion of the first material portion within the first space and the entire of the second material portion within the second space.

Example embodiment 20 based on Example embodiment 18: in forming the dielectric wall material within the first space and the second space, the second material portion has a recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a substrate comprising a first protrusion, a second protrusion and a third protrusion;

a first active region disposed on the first protrusion;

a second active region disposed on the second protrusion and adjacent to the first active region, wherein there is a first space between the first active region and the second active region, and there is no jog within the first space; and a dielectric wall formed within the first recess and first space between the first active region and the second active region;

a third active region disposed on the third protrusion and adjacent to the second active region;

wherein there is a second space between the second active region and the third active region;

wherein there is a first jog in the second active region, there is a second jog in the third active region, and the first jog and the second jog are opposite to each other in the second space.

2. The semiconductor device as claimed in claim 1, wherein the first active region has a first lateral surface, the second active region has a second lateral surface opposite to the first lateral surface, and the first lateral surface and the second lateral surface continuously extend along a plane.

3. The semiconductor device as claimed in claim 1, further comprising:

a metal gate covering the first jog and the second jog.

4. The semiconductor device as claimed in claim 1, wherein the first active region comprises a first source/drain epitaxy having a first end surface, the second active region comprises a second source/drain epitaxy having a second end surface, the first source/drain epitaxy and the second source/drain epitaxy are disposed on adjacent two sides of the dielectric wall, and the dielectric wall extends close to the first end surface and the second end surface.

5. The semiconductor device as claimed in claim 1, wherein the first active region further comprises a plurality of sheets, and the dielectric wall extends to a position corresponding to the topmost sheet.

6. The semiconductor device as claimed in claim 1, wherein the first active region and the second active region surround the dielectric wall.

7. The semiconductor device as claimed in claim 1, wherein the dielectric wall comprises a shell layer and a core layer, the shell layer covers a lateral sidewall of the first space, and the core layer fills up the remain first space.

8. The semiconductor device as claimed in claim 1, wherein the first space has a wall width, the second space has a narrower width and a wider width greater than the narrower width, and the wall width is less than the narrower width.

9. The semiconductor device as claimed in claim 8, wherein the wall width is equal to or greater than a difference between the narrower width and 20 nanometers.

10. A semiconductor device, comprising:

a substrate comprising a first protrusion, a second protrusion and a third protrusion;

a first active region disposed on the first protrusion;

a second active region disposed on the second protrusion and adjacent to the first active region, wherein there is a first space between the first active region and the second active region; and a dielectric wall formed within the first space and having a first lateral wall surface and a second lateral wall surface opposite to the first lateral wall surface;

wherein the first lateral wall surface and the second lateral wall surface are continuously extend along a plane;

a third active region disposed on the third protrusion adjacent to the second active region;

wherein there is a second space between the second active region and the third active region;

wherein there is a first jog in the second active region, there is a second jog in the third active region, and the first jog and the second jog are opposite to each other in the second space.

11. The semiconductor device as claimed in claim 10, wherein the first active region has a first lateral surface, the second active region has a second lateral surface opposite to the first lateral surface, and the first lateral surface and the second lateral surface continuously extend along a plane.

12. The semiconductor device as claimed in claim 10, wherein the first active region comprises a first source/drain epitaxy having a first end surface, the second active region comprises a second source/drain epitaxy having a second end surface, the first source/drain epitaxy and the second source/drain epitaxy are disposed on adjacent two sides of the dielectric wall, and the dielectric wall extends close to the first end surface and the second end surface.

13. The semiconductor device as claimed in claim 10, wherein the first active region further comprises a plurality of sheets, and the dielectric wall extends to a position corresponding to the topmost sheet.

14. The semiconductor device as claimed in claim 10, wherein the first active region and the second active region surround the dielectric wall.

15. The semiconductor device as claimed in claim 10, wherein the dielectric wall comprises a shell layer and a core layer, the shell layer covers a lateral sidewall of the first space, and the core layer fills up the remain first space.

16. The semiconductor device as claimed in claim 10, wherein the first space has a wall width, the second space has a narrower width and a wider width greater than the narrower width, and the wall width is less than the narrower width.

17. The semiconductor device as claimed in claim 16, wherein the wall width is equal to greater than the narrower width and 20 nanometers.

18. A manufacturing method of a semiconductor device, comprising:

forming a substrate, wherein the substrate comprises a first protrusion, a second protrusion and a third protrusion;

forming a first fin structure disposed on the first protrusion and a second fin structure on the second protrusion and adjacent to the first fin structure, wherein there is a first space between the first fin structure and the second fin structure, and there is no jog within the first space;

forming a third active region on the third protrusion and adjacent to the second active region, wherein there is a second space between the second active region and the third active region; and forming a dielectric wall within the first space between the first fin structure and the second fin structure;

wherein there is a first jog in the second active region, there is a second jog in the third active region, and the first jog and the second jog are opposite to each other in the second space.

19. The manufacturing method as claimed in claim 18, further comprising:

forming a third fin structure adjacent to the second fin structure, wherein the second space is located between the second fin structure and the third fin structure;

forming a dielectric wall material within the first space and the second space, wherein the dielectric wall material comprises a first material portion within the first space and a second material portion within the second space; and removing a portion of the first material portion within the first space and the entire of the second material portion within the second space.

20. The manufacturing method as claimed in claim 19, wherein in forming the dielectric wall material within the first space and the second space, the second material portion has a recess.

* * * * *